US009036365B2

(12) United States Patent
Kusumoto et al.

(10) Patent No.: US 9,036,365 B2
(45) Date of Patent: May 19, 2015

(54) INTERCONNECTION SUBSTRATE DESIGN SUPPORTING DEVICE, METHOD OF DESIGNING INTERCONNECTION SUBSTRATE, PROGRAM, AND INTERCONNECTION SUBSTRATE

(75) Inventors: Manabu Kusumoto, Tokyo (JP); Naoki Kobayashi, Tokyo (JP); Noriaki Ando, Tokyo (JP); Hiroshi Toyao, Tokyo (JP)

(73) Assignee: NEC Corporation, Tokyo (JP)

( * ) Notice: Subject to any disclaimer, the term of this patent is extended or adjusted under 35 U.S.C. 154(b) by 385 days.

(21) Appl. No.: 13/502,936

(22) PCT Filed: Oct. 6, 2010

(86) PCT No.: PCT/JP2010/005990
§ 371 (c)(1),
(2), (4) Date: Jun. 15, 2012

(87) PCT Pub. No.: WO2011/048763
PCT Pub. Date: Apr. 28, 2011

(65) Prior Publication Data
US 2012/0261178 A1    Oct. 18, 2012

(30) Foreign Application Priority Data

Oct. 20, 2009    (JP) .................................. 2009-241648

(51) Int. Cl.
*H05K 1/11* (2006.01)
*G06F 17/50* (2006.01)
(Continued)

(52) U.S. Cl.
CPC .......... *H05K 3/0005* (2013.01); *G06F 17/5077* (2013.01); *H05K 1/116* (2013.01); *H05K 3/429* (2013.01); *H05K 2201/09718* (2013.01)

(58) Field of Classification Search
CPC ............ H05K 3/429; H05K 2201/096; H05K 2201/093; H05K 1/112; H05K 1/115; H05K 1/141; H05K 1/144; H05K 1/0298; H05K 1/0216–1/0227; H01R 9/096
USPC .......... 174/262, 260, 257; 361/748, 760, 794, 361/803; 716/100, 106, 110, 111, 116, 118, 716/119
See application file for complete search history.

(56) References Cited

U.S. PATENT DOCUMENTS

| 5,590,030 A | 12/1996 | Kametani et al. |
| 6,262,495 B1 | 7/2001 | Yablonovitch et al. |

(Continued)

FOREIGN PATENT DOCUMENTS

| CN | 1791300 A | 6/2006 |
| JP | 2006-302986 A | 11/2006 |

OTHER PUBLICATIONS

International Search Report in PCT/JP2010/005990 dated Jan. 11, 2011 (English Translation thereof).

(Continued)

*Primary Examiner* — Hoa C Nguyen
(74) *Attorney, Agent, or Firm* — McGinn IP Law Group, PLLC

(57) ABSTRACT

A via disposition information acquiring unit acquires via disposition information indicating a disposition of the plurality of first vias (212). A second conductor information acquiring unit acquires second conductor information indicating disposition positions of a plurality of second conductors (232) repeatedly disposed in the second conductor layer (230). A via extracting unit extracts an extraction via with respect to each of the plurality of second conductors (232). The extraction via is each of the first vias (212) overlapping the second conductor (232). A via selecting unit selects a selection via with respect to each of the plurality of second conductors (232). The selection via is each of first vias (212) selected in a predetermined number from the extraction vias. An opening introducing unit introduces a first opening (234) to each of the plurality of second conductors (232). The first opening (234) overlaps the extraction via not selected by the via selecting unit in plan view.

20 Claims, 23 Drawing Sheets

(51) Int. Cl.
*H05K 3/00* (2006.01)
*H05K 3/42* (2006.01)

(56) References Cited

U.S. PATENT DOCUMENTS

| | | | |
|---|---|---|---|
| 7,215,007 B2* | 5/2007 | McKinzie et al. | 257/664 |
| 7,488,676 B2 | 2/2009 | Kanaya et al. | |
| 7,889,134 B2* | 2/2011 | McKinzie et al. | 343/700 MS |
| 8,004,369 B2* | 8/2011 | Kwon et al. | 333/12 |
| 8,354,975 B2* | 1/2013 | Ando et al. | 343/913 |
| 2006/0170113 A1* | 8/2006 | Tanaka et al. | 257/778 |
| 2006/0232949 A1 | 10/2006 | Osaka | |
| 2007/0091581 A1* | 4/2007 | Gisin et al. | 361/782 |
| 2007/0176827 A1 | 8/2007 | Itoh et al. | |
| 2007/0194433 A1* | 8/2007 | Suwa et al. | 257/700 |
| 2008/0117583 A1* | 5/2008 | Lauffer et al. | 361/683 |
| 2008/0223628 A1* | 9/2008 | Lyon et al. | 178/18.01 |
| 2009/0133913 A1* | 5/2009 | Kushta et al. | 174/260 |
| 2010/0265159 A1* | 10/2010 | Ando et al. | 343/913 |
| 2012/0119853 A1* | 5/2012 | Kushta | 333/204 |

OTHER PUBLICATIONS

Noriaki Ando, et al., "A Study on Electromagnetic Bandgap (EBG) Structures for Suppression of Power Noise in Electronic Equipment: Novel; Inductance-Enhanced EBG Structures", IEICE Technical Report, Jan. 18, 2008, vol. 107, No. 456, pp. 25-30.

Shahparnia, S., et al., "Electromagnetic interference (EMI) reduction from printed circuit boards (PCB) using electromagnetic bandgap structures", IEEE Transactions on Electromagnetic Compatibility, Nov. 30, 2004, vol. 46, No. 4, pp. 580-587.

Shahparnia, S., et al., "A simple and effective model for electromagnetic bandgap structures embedded in printed circuit boards", IEEEE Microwave and Wireless Component Letters, Sep. 26, 2005, vol. 15, Issue 10, pp. 621-623.

* cited by examiner

INTERCONNECTION SUBSTRATE DESIGN SUPPORTING DEVICE, METHOD OF DESIGNING INTERCONNECTION SUBSTRATE, PROGRAM, AND INTERCONNECTION SUBSTRATE

TECHNICAL FIELD

The present invention relates to an interconnection substrate design supporting device for supporting the design of interconnection substrates having a multilayer interconnection structure, a method of designing an interconnection substrate, a program, and an interconnection substrate.

BACKGROUND ART

It has been found that the periodic arrangement of second conductor patterns having a specific structure (hereinafter, described as a metamaterial) enables control of the propagation characteristic of an electromagnetic wave. Examples of a related technology with respect to the metamaterial include a technology described in Patent Documents 1 and 2. The technology described in Patent Document 1 relates to a structure, a so-called mushroom-type metamaterial in which a plurality of island-shaped second conductor patterns is disposed above a sheet-shaped second conductor pattern, and each of the island-shaped second conductor patterns is connected to the sheet-shaped second conductor pattern through a via.

The metamaterial has a property of suppressing propagation of electromagnetic waves in a specific frequency band. If the metamaterial structure is introduced to the interconnection substrate, the noise may be prevented from propagating at the inside of the interconnection substrate (for example, Patent Document 3).

RELATED DOCUMENTS

Patent Documents

[Patent Document 1] U.S. Pat. No. 6,262,495
[Patent Document 2] Specification of U.S. Patent Application Publication No. 2007/0176827
[Patent Document 3] Japanese Unexamined Patent Application Publication No. 2006-302986

DISCLOSURE OF THE INVENTION

An interconnection structure of an interconnection substrate such as a printed substrate and an interposer is designed according to the intended use. This makes it difficult to change the via position. As a result, if the metamaterial structure is introduced to an already-designed interconnection substrate, the via layout is preferably not changed for constructing the metamaterial structure. Nevertheless, if the via layout is not changed, the unnecessary vias may connect to the metamaterial structure, and as a result, the metamaterial properties may deviate from its intended design.

An object of the invention is to provide an interconnection substrate design supporting device, a method of designing an interconnection substrate, a program, and an interconnection substrate, each of which is capable of preventing the unnecessary vias from connecting to the metamaterial structure, and as a result, the metamaterial properties can be prevented from deviating from its intended design when the metamaterial structure is introduced to an already-designed interconnection substrate.

According to an embodiment of the invention, there is provided an interconnection substrate design supporting device designing an interconnection substrate, the interconnection substrate being including a first conductor layer, a second conductor layer, and a plurality of first vias extending from the first conductor layer to the second conductor layer, the device comprising:

the plurality of first via having one end connecting to a first conductor located in the first conductor layer;
a via disposition information acquiring unit acquiring via disposition information indicating a disposition of the plurality of first vias;
a second conductor information acquiring unit acquiring second conductor information indicating disposition positions of a plurality of second conductors, the plurality of second conductors being repeatedly disposed in the second conductor layer;
a via extracting unit extracting an extraction via with respect to each of the plurality of second conductors, the extraction via being each of the first via overlapping the second conductor;
a via selecting unit selecting a selection via with respect to each of the plurality of second conductors, the selection via being each of the first vias selected in a predetermined number from the extraction vias; and an opening introducing unit introducing a first opening to each of the plurality of second conductors, the first opening being overlapping the extraction via not selected by the via selecting unit in plan view.

According to another embodiment of the invention, there is provided an interconnection substrate design supporting device designing an interconnection substrate, the interconnection substrate being including a first conductor layer, a second conductor layer, and a plurality of first vias extending from the first conductor layer to the second conductor layer, the device comprising:

the plurality of first vias having one end connecting to a first conductor located in the first conductor layer;
a via disposition information acquiring unit acquiring via disposition information indicating a disposition of the plurality of first vias;
a disposition-permitted region information acquiring unit acquiring disposition-permitted region information with respect to each of a plurality of second conductors, the plurality of second conductors being repeatedly disposed in the second conductor layer, the disposition-permitted region information being indicating a disposition-permitted region of the second conductors;
a via extracting unit extracting an extraction via with respect to each of the plurality of second conductors, the extraction via being each of the first vias overlapping the disposition-permitted region of the second conductor;
a via selecting unit selecting a selection via with respect to each of the plurality of second conductors, the selection via being each of the first vias selected in a predetermined number from the extraction vias; and a second conductor disposing unit determining the disposition of the second conductor in a manner such that the second conductor connects to the selection via.

According to still another embodiment of the invention, there is provided a method of designing an interconnection substrate, the interconnection substrate being including a first conductor layer, a second conductor layer, and a plurality of first vias extending from the first conductor layer to the second conductor layer, the plurality of first vias being having one end connecting to a first conductor located in the first conductor layer, the method comprising:

acquiring via disposition information indicating a disposition of the plurality of first vias;

acquiring second conductor information indicating disposition positions of a plurality of second conductors, the plurality of second conductors being repeatedly disposed in the second conductor layer;

extracting an extraction via with respect to each of the plurality of second conductors, the extraction via being each of the first vias overlapping the second conductor;

selecting a selection via with respect to each of the plurality of second conductors, the selection via being each of first vias selected in a predetermined number from the extraction vias; and introducing a first opening to each of the plurality of second conductors, the first opening being overlapping the extraction via not selected as the selection via in plan view.

According to still another embodiment of the invention, there is provided a method of designing an interconnection substrate, the interconnection substrate being including a first conductor layer, a second conductor layer, and a plurality of first vias extending from the first conductor layer to the second conductor layer, the plurality of first vias being having one end connecting to a first conductor located in the first conductor layer, the method comprising:

acquiring via disposition information indicating a disposition of the plurality of first vias;

acquiring second conductor information with respect to each of a plurality of second conductors, the plurality of second conductors being repeatedly disposed in the second conductor layer, the second conductor information being indicating a disposition-permitted region of the second conductors;

extracting an extraction via with respect to each of the plurality of second conductors, the extraction via being each of the first vias overlapping the disposition-permitted region of the second conductor;

selecting a selection via with respect to each of the plurality of second conductors, the selection via being each of the first vias selected in a predetermined number from the extraction vias; and determining the disposition of the second conductor in a manner such that the second conductor connects to the selection via.

According to still another embodiment of the invention, there is provided a program causing a computer to function as an interconnection substrate designing device that designs an interconnection substrate, the interconnection substrate being including a first conductor layer, a second conductor layer, and a plurality of first vias extending from the first conductor layer to the second conductor layer, the plurality of first vias being having one end connecting to a first conductor located in the first conductor layer, the program causing the computer to execute:

a function of acquiring via disposition information indicating a disposition of the plurality of first vias;

a function of acquiring second conductor information indicating disposition positions of a plurality of second conductors, the plurality of second conductors being repeatedly disposed in the second conductor layer;

a function of extracting an extraction via with respect to each of the plurality of second conductors, the extraction via being each of the first vias overlapping the second conductor;

a function of selecting a selection via with respect to each of the plurality of second conductors, the selection via being the each of first vias selected in a predetermined number from the extraction vias; and a function of introducing a first opening to each of the plurality of second conductors, the first opening being overlapping the extraction via not selected as the selection via in plan view.

According to still another embodiment of the invention, there is provided a program causing a computer to function as an interconnection substrate designing device that designs an interconnection substrate, the interconnection substrate being including a first conductor layer, a second conductor layer, and a plurality of first vias extending from the first conductor layer to the second conductor layer, the plurality of first vias being having one end connecting to a first conductor located in the first conductor layer, the program causing the computer to execute:

a function of acquiring via disposition information indicating a disposition of the plurality of first vias;

a function of acquiring second conductor information with respect to each of a plurality of second conductors, the plurality of second conductors being repeatedly disposed in the second conductor layer, the second conductor information being indicating a disposition-permitted region of the second conductors;

a function of extracting an extraction via with respect to each of the plurality of second conductors, the extraction via being each of the first vias overlapping the disposition-permitted region of the second conductor;

a function of selecting a selection via with respect to each of the plurality of second conductors, the selection via being each of the first vias selected in a predetermined number from the extraction vias; and a function of determining the disposition of the second conductor in a manner such that the second conductor connects to the selection via.

According to still another embodiment of the invention, there is provided an interconnection substrate comprising:

a first conductor layer in which a first conductor is provided;

a second conductor layer in which a plurality of second conductors are repeatedly provided at regions, each overlapping the first conductor in plan view; and a plurality of first vias having one end connecting to the first conductor and the other end penetrating through the second conductor layer, wherein each of the plurality of second conductors connects to the first conductor through either the first vias or the second via, and at least one of the plurality of second conductors connects to a first one of the first vias, and includes an opening at a region overlapping a second one of the first vias.

According to still another embodiment of the invention, there is provided an interconnection substrate comprising:

a first conductor layer in which a first conductor is provided;

a second conductor layer;

a plurality of first vias having one end connecting to the first conductor and the other end penetrating through the second conductor layer; and a plurality of interconnect-shaped second conductors repeatedly provided in the second interconnection layer, each being having one end connecting to any one of the first vias, and the second conductors being connected only to the first vias, wherein some of the plurality of first vias do not connect to the second conductors.

According to the present invention, it is possible to prevent an unnecessary via from connecting to a metamaterial structure, and as a result, a metamaterial property can be prevented from deviating from its intended design when the metamaterial structure is introduced to an already-designed interconnection substrate.

BRIEF DESCRIPTION OF THE DRAWINGS

The above and other objects, advantages and features of the present invention will be more apparent from the following description of certain preferred embodiments taken in conjunction with the accompanying drawings.

DESCRIPTION OF EMBODIMENTS

Figure 1:
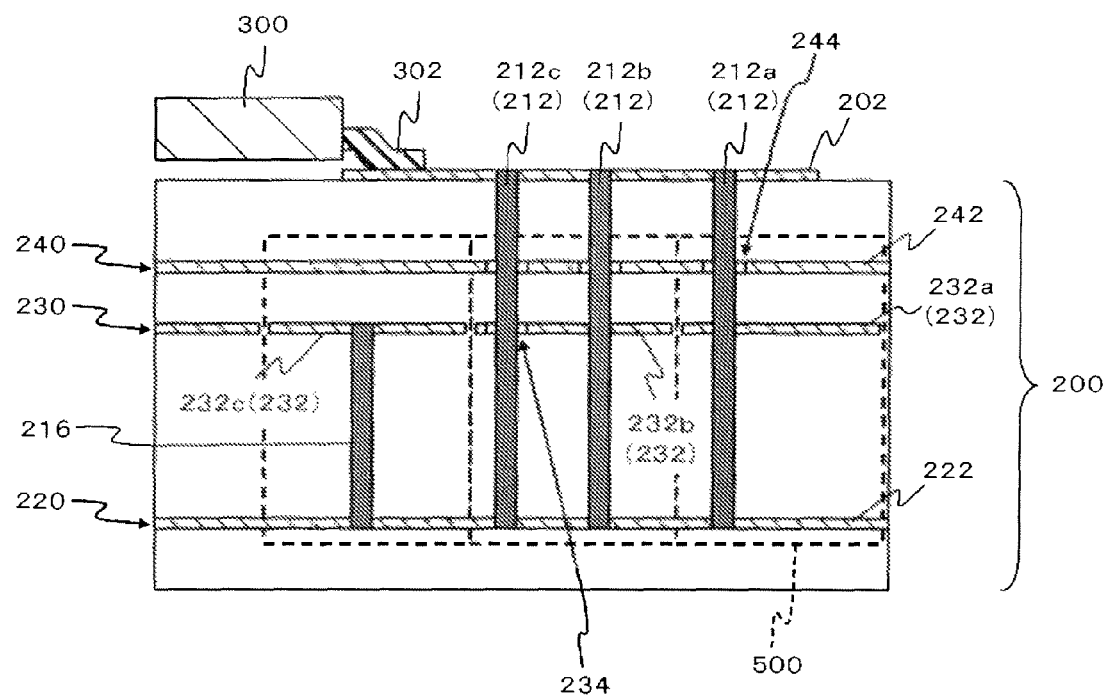
FIG. 1 is a cross-sectional view of an electronic device according to a first embodiment.

Hereinafter, an embodiment of the invention will be described using the attached drawings. In addition, in all of the drawings, like reference numerals will be given to like parts having substantially the same functions, and redundant description thereof will not be repeated.

First Embodiment

FIG. 1 shows a cross-sectional view of an electronic apparatus according to a first embodiment. The electronic device includes an interconnection substrate 200. The interconnection substrate 200 includes a first conductor layer 220, a second conductor layer 230, and a plurality of first vias 212. The first conductor layer 220 includes a first conductor 222. The second conductor layer 230 includes a plurality of second conductor 232 repeatedly, for example, in a periodical manner. One end of each of the plurality of first vias 212 is connected to the first conductor 222 located in the first conductor layer 220, and the other end penetrates through the second conductor layer 230. Each of the plurality of second conductors 232 is connected to the first conductor 222 through either the first vias 212 or a second via 216. Moreover, at least one of the second conductors 232 (for example, a second conductor 232b) has one end connected to a first one (for example, a first via 212b) of the first vias 212, and is provided with a first opening 234 at a region overlapping a second one (for example, a first via 212c) of the first vias 212.

The interconnection substrate 200 is further provided with a third conductor layer 240. The third conductor layer 240 is located at the same side as the second conductor layer 230 from a viewpoint of the first conductor layer 220, and is provided with a third conductor 242 at a region overlapping the first conductor 222 in plan view. The plurality of first vias 212 extends to one surface of the interconnection substrate 200. The third conductor 242 is provided with a plurality of third openings 244. The plurality of third openings 244, for allowing a passage of the plurality of first via 212 but preventing them from being in contact with the third conductor 242, are provided at positions overlapping the plurality of first vias 212 in plan view. In this embodiment, the first conductor 222 is a ground plane, and the third conductor 242 is a power supply plane. The power supply plane and the ground plane may be inverted from each other.

In this configuration, at least a part of a unit cell 500 is made up by the second conductor 232, a region of the first conductor 222 opposite to the second conductor 232, and the first via 212 or the second via 216 in contact with both the second conductor 232 and the first conductor 222. The repetitive arrangement of the unit cell 500 (for example, in a periodic manner) results in configuration of a metamaterial structure. In an example shown in this drawing, the unit cell 500 is made up by the second conductor 232, a region of the first conductor 222 opposite to the second conductors 232, the first via 212 in contact with both the second conductor 232 and the first conductor 222, and a region of the third conductor 242 opposite to the second conductor 232. Thus, the unit cell 500 has a so-called mushroom structure. Specifically, the first conductor 222 corresponds to a lower side plane, and the third conductor 242 corresponds to an upper side plane. The second conductors 232 correspond to a head portion of a mushroom, and the first via 212 corresponds to an inductance portion of the mushroom.

If the unit cell 50 is disposed "repetitively", a distance between corresponding vias in the adjacent unit cells 50 (an inter-center distance) is preferably within a half of wavelength λ of an electromagnetic wave regarded as a noise. The "repetition" includes also a case in which a part of configurations is deficient in any unit cell 50. If the unit cell 50 has a two-dimensional disposition, the "repetition" includes also a case in which the unit cell 50 is partially deficient. The "periodic manner" includes a case in which a part of constituent elements are deviated in some unit cells 50, and also a case in which disposition itself of some unit cells 50 is deviated. That is, even when a periodicity in a strict meaning is collapsed, a defect is permitted to "periodicity" to some extent because a property of the metamaterial may be obtained in a case where the unit cell 50 is repetitively disposed. Assumed causes of occurrence of this defect include a case in which an interconnect or via is made to pass between unit cells 50, a case in which the unit cell 50 may not be disposed due to an existing via or pattern when a metamaterial structure is added to an existing interconnection layout, a manufacturing error, a case in which the existing via or pattern is used as a part of the unit cell, and the like.

A semiconductor package 300, an example of the electronic device, is mounted on one surface of the interconnection substrate 200. A ground terminal 302 of the semiconductor package 300 is connected to the first conductor 222 through the plurality of first via 212 and a conductor pattern 202 provided on one surface of the interconnection substrate 200. The semiconductor package 300 is connected to the third conductor 242 through a power supply terminal 301, a conductor pattern 201, and a power supply via 211 described later. As described above, the first conductor 222 is a ground plane, and the third conductor 242 is a power supply plane. For this reason, the semiconductor package 300 may serve as a noise source and a noise may enter the third conductor 242 serving as a power supply plane, or contrary to this, the noise may propagate to the semiconductor package 300 through the third conductor 242. In this embodiment, the unit cell 500 is made up by the second conductor 232, a region of the first conductor 222 opposite to the second conductor 232, the first via 212 connected to both the second conductor 232 and the first conductor 222, and a region of the third conductor 242 opposite to the second conductor 232. This configuration prevents the noise from propagating through the third conductor 242.

Figure 2:
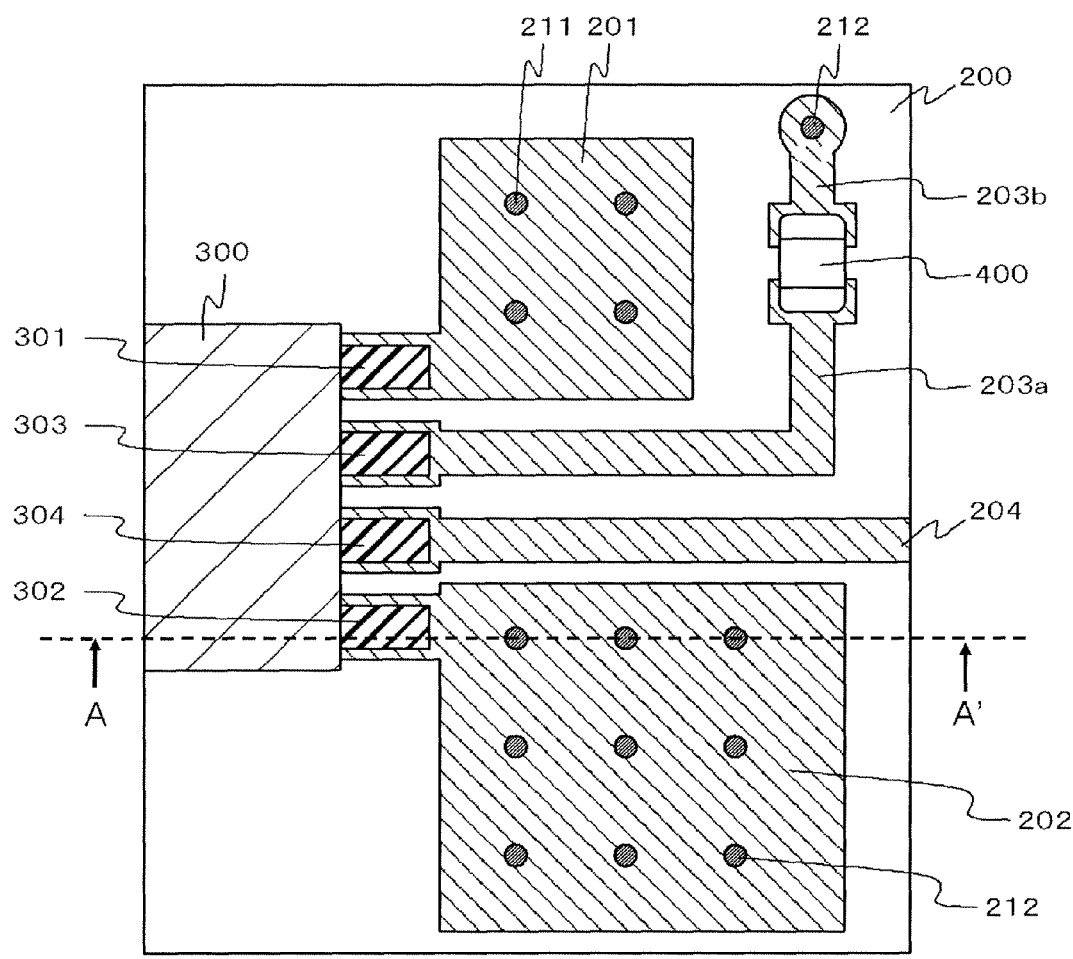
FIG. 2 is a top plan view of the electronic device shown in FIG. 1.

FIG. 2 shows a top plan view of the electronic device shown in FIG. 1. FIG. 1 corresponds to a cross-sectional view taken along A-A' in FIG. 2. As described above, the semiconductor package 300 is mounted on one surface of the interconnection substrate 200. The semiconductor package 300 is provided with the power supply terminal 301, a ground terminal 302, and signal terminals 303 and 304. The power supply terminal 301 is connected to one end of the power supply via 211 through the conductor pattern 201. The other end of the power supply via 211 is connected to the third conductor 242 shown in FIG. 1. The ground terminal 302 is connected to one end of each of the first vias 212 through the conductor pattern 202. The signal terminal 303 is connected to one end of another first via 212 through an interconnect 203a, an electronic element (for example, an analogue element such as a resistive element and a capacitive element) 400, and an interconnect 203b. The signal terminal 304 is connected to a signal via (not shown) through an interconnect 204.

Figure 3:
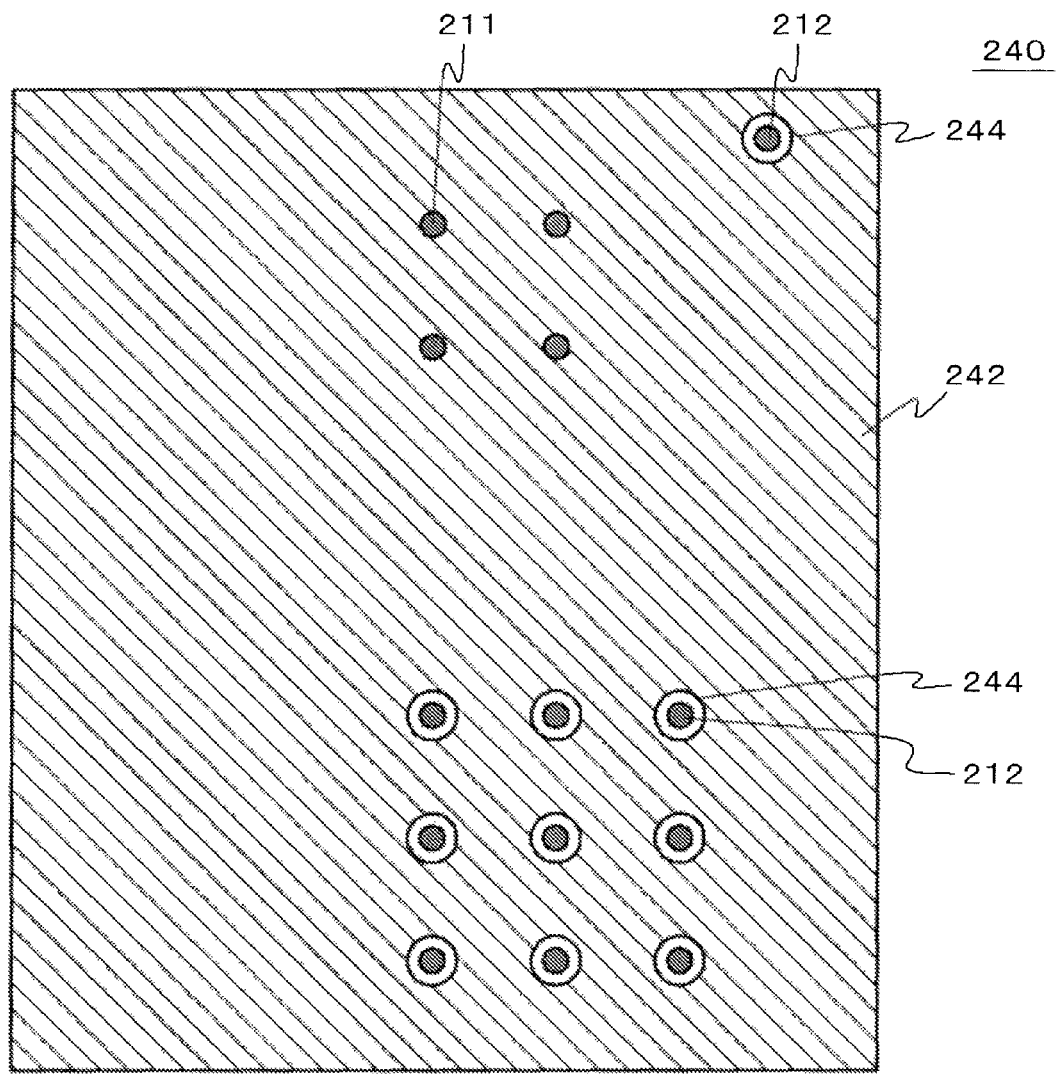
FIG. 3 is a plan view of a third conductor layer of an interconnection substrate shown in FIG. 1.

FIG. 3 shows a plan view of the third conductor layer 240 of the interconnection substrate 200 shown in FIG. 1. The third conductor 242 of the third conductor layer 240 is a power supply plane, and is formed in a sheet shape across a constant region of the interconnection substrate 200. The other end of the power supply via 211 is connected to the third conductor 242. The third conductor 242 is provided with a third opening 244 at a region overlapping a signal via (not shown) and the first via 212. The provision of the third opening 244 prevents the signal via and the first via 212 from being short-circuited with the third conductor 242.

Figure 4:
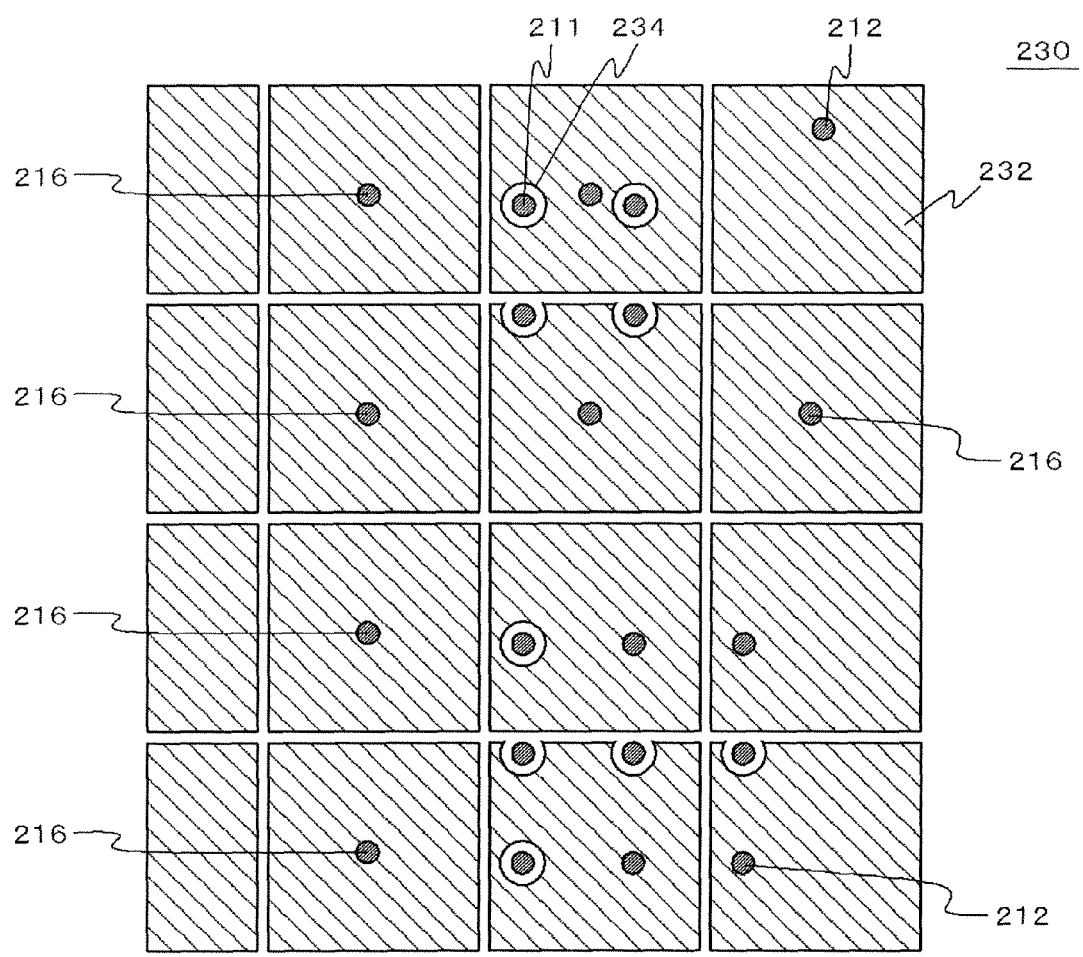
FIG. 4 is a plan view of a second conductor layer of the interconnection substrate shown in FIG. 1.

FIG. 4 shows a plan view of the second conductor layer 230 of the interconnection substrate 200 shown in FIG. 1. In the second conductor layer 230, the plurality of second conductor 232 is disposed in such a way that they can configure a lattice. In an example shown in this drawing, each of the second conductors 232 has a rectangular shape (for example, a square). When the second conductor 232 overlaps any one of the first via 212, the second conductor 232 is connected through the first via 212 to the first conductor 222 shown in FIG. 1. When the second conductor 232 does not overlap anyone of the first vias 212, the second conductor 232 is connected to the first conductor 222 through each of the second via 216. The second via 216 overlaps the center of the second conductor 232. The second conductor 232 is provided with the first opening 234 at a region overlapping the signal via (not shown) and the power supply via 211. The provision of the first opening 234 prevents the power supply via 211 and the signal via from being short-circuited with the second conductor 232.

One of the second conductors 232 may be connected to a predetermined number (one in an example in this drawing) of first vias 212 or the second vias 216. In a case where the second conductor 232 overlaps the first vias 212 in more than the predetermined number, the first opening 234 is also provided at a region overlapping surplus first vias 212 so that only the predetermined number of first vias 212 are allowed to connect to the second conductor 232.

Figure 5:
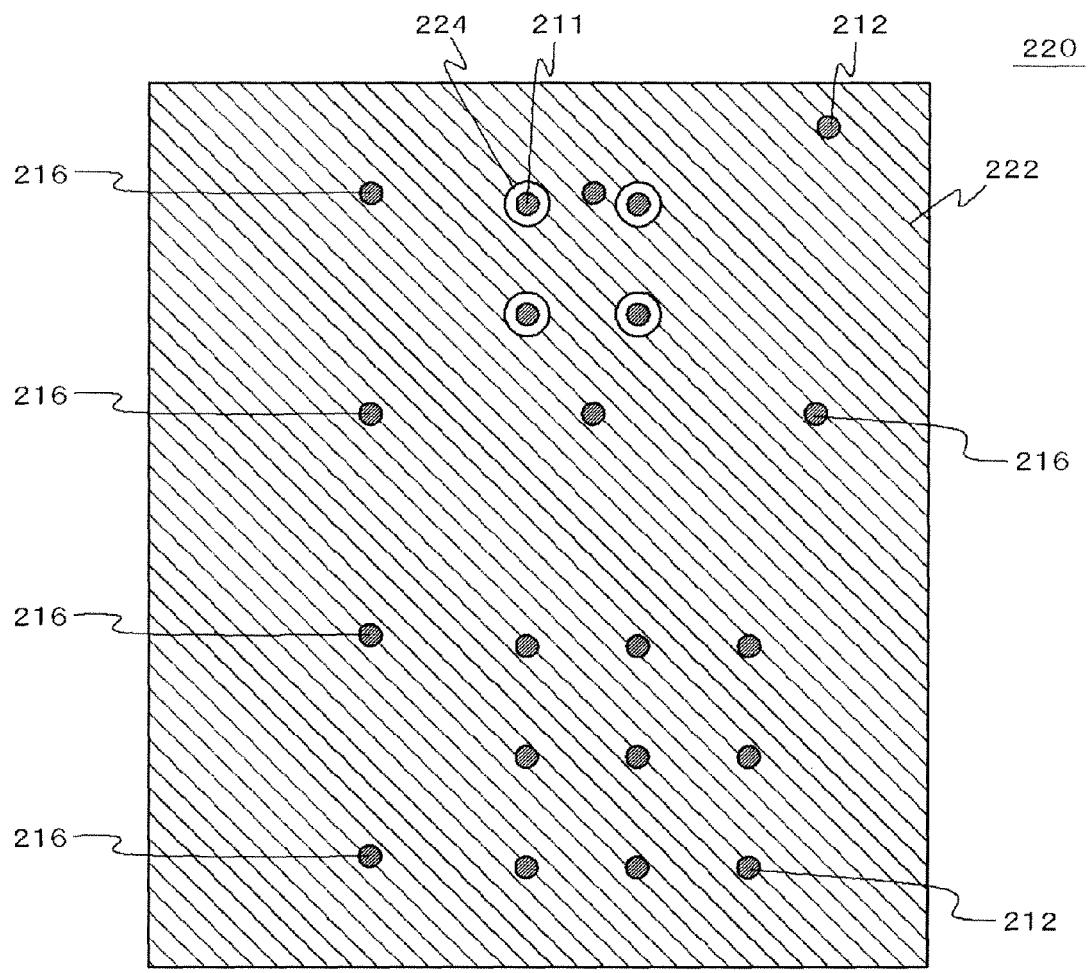
FIG. 5 is a plan view of a first conductor layer of the interconnection substrate shown in FIG. 1.

FIG. 5 shows a plan view of the first conductor layer 220 of the interconnection substrate 200 shown in FIG. 1. The first conductor 222 of the first conductor layer 220 is a ground plane, and is formed in a sheet shape across a constant region of the interconnection substrate 200. The first conductor 222 is connected to the third conductor 242 and the plurality of second conductors 232 in plan view. The first vias 212 and the second vias 216 are connected to the first conductor 222. The first conductor 222 is provided with an opening 224 at each region overlapping the signal via (not shown) and the power supply via 211. The provision of the opening 224 prevents the power supply via 211 and the signal via from being short-circuited with the first conductor 222.

Figure 6:
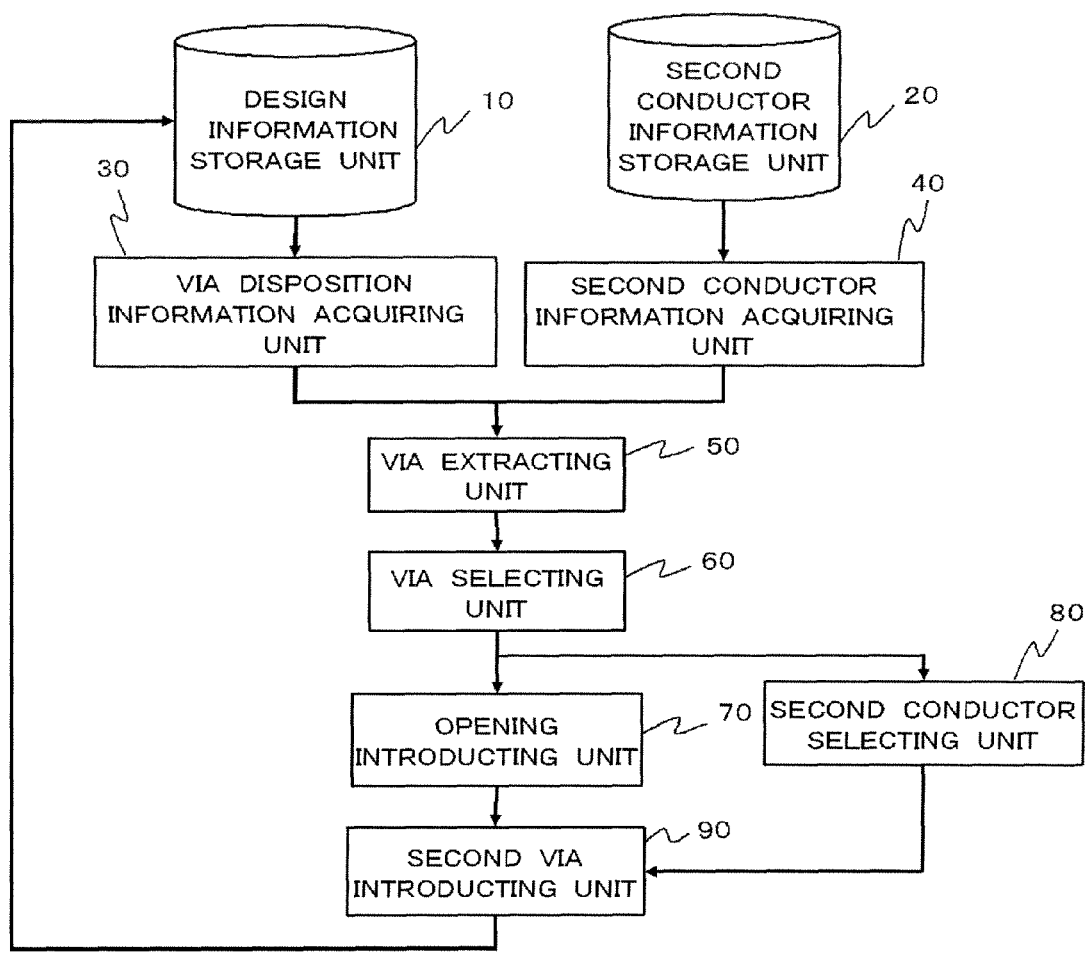
FIG. 6 is a block diagram illustrating a functional configuration of an interconnection substrate design supporting device for supporting the design of the interconnection substrate.

FIG. 6 shows a block diagram illustrating a functional configuration of an interconnection substrate design supporting device for supporting the design of the interconnection substrate 200. The interconnection substrate design supporting device includes a via disposition information acquiring unit 30, a second conductor information acquiring unit 40, a via extracting unit 50, a via selecting unit 60, and an opening introducing unit 70. The via disposition information acquiring unit 30 acquires via disposition information indicating a disposition of the plurality of first vias 212. The second conductor information acquiring unit 40 acquires second conductor information indicating disposition positions of the plurality of second conductors 232 repeatedly disposed in the second conductor layer 230. The via extracting unit 50 extracts an extraction via with respect to each of the plurality of second conductors 232. The extraction via is each of the first vias 212 overlapping the second conductor 232. The via selecting unit 60 selects a selection via with respect to each of the plurality of second conductors 232. The selection via is each of the first vias 212 selected in a predetermined number from the extraction vias. The opening introducing unit 70 introduces a first opening 234 to each of the plurality of second conductors 232. The first opening 234 overlaps the extraction via not selected by the via selecting unit 60 in plan view.

The interconnection substrate design supporting device includes also a second conductor selecting unit 80 and a second via introducing unit 90. The second conductor selecting unit 80 selects, from the plurality of the second conductors 232, a second conductor 232 in which the extraction via is not selected, that is, a second conductor 232 not overlapping any one of the first vias 212. The second via introducing unit 90 performs a process of introducing the second via to the interconnection substrate. The second via connects the first conductor 222 to the second conductor 232 selected by the second conductor selecting unit 80.

The interconnection substrate design supporting device includes a design information storage unit 10 and a second conductor information storage unit 20. The design information storage unit 10 stores design data of the interconnection substrate 200. The design data stored in the design information storage unit 10 includes via disposition information. The design data stored in the design information storage unit 10 is updated to the design data in which the second via introducing unit 90 has introduced the plurality of second conductors 232, the first opening 234, and the second via 216. The second conductor information storage unit 20 stores second conductor information indicating disposition positions of the second conductors 232 to be introduced to the interconnection substrate 200.

FIG. 6 does not show configurations of portions not related to the essence of the invention. Each constituent element of the interconnection substrate design supporting device shown in FIG. 6 indicates a block of a functional unit rather than a hardware unit. Each constituent element of the interconnection substrate design supporting device is realized by a CPU of an arbitrary computer, a memory, a program loaded in the memory and realizing the constituent element in this drawing, a storage unit such as a hard disk storing the program, and an arbitrary combination of hardware and software with a network connection interface given as a main component. A person skilled in the art would understand that various modification examples may be made in a realizing method and a realizing device. The interconnection substrate design supporting device shown in FIG. 6 may be constructed by install of a program into a computer. This facilitates construction of the interconnection substrate design supporting device.

Figure 7:
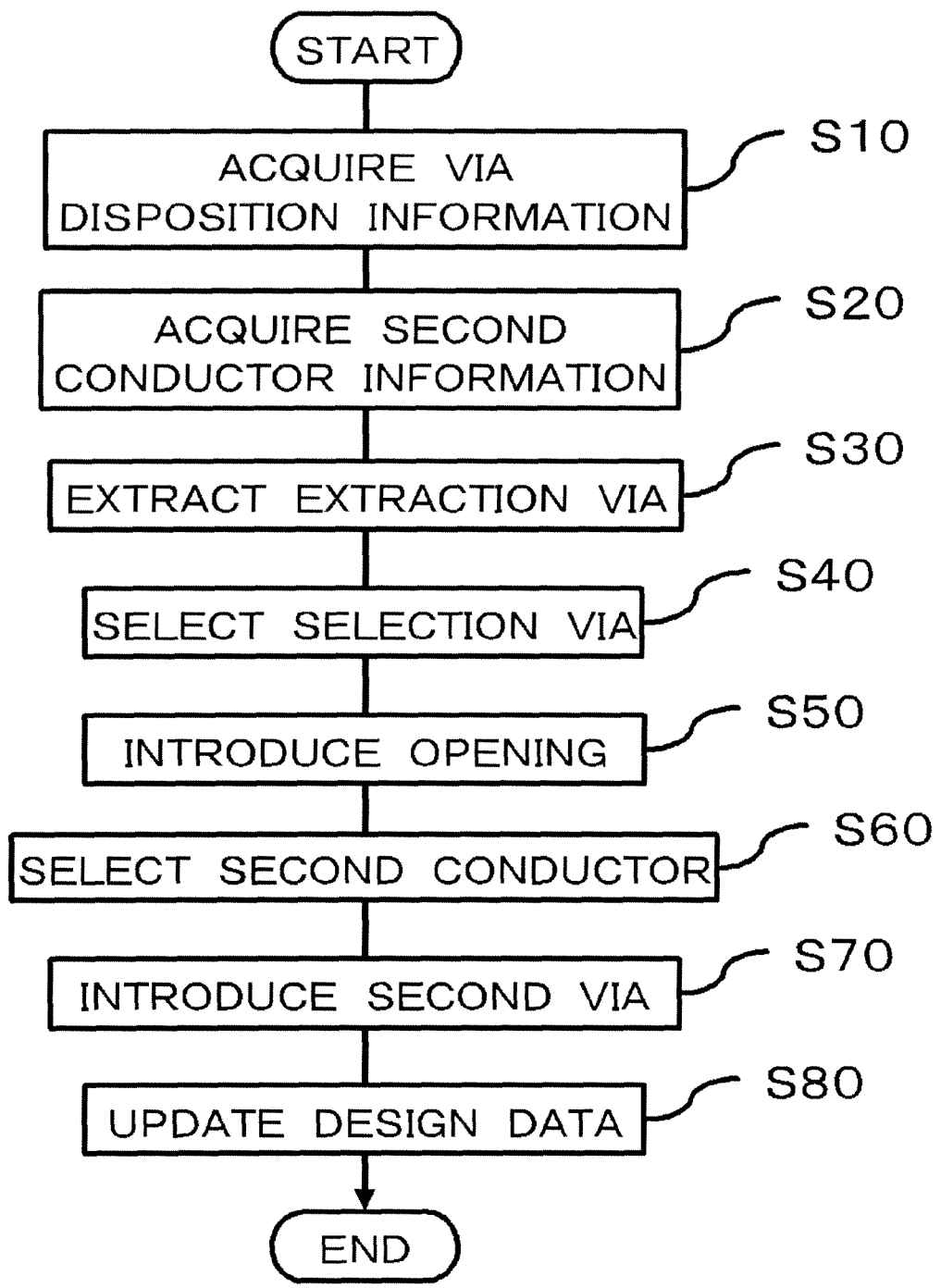
FIG. 7 is a flowchart illustrating a method of designing the interconnection substrate using the interconnection substrate design supporting device shown in FIG. 6.
Figure 8:
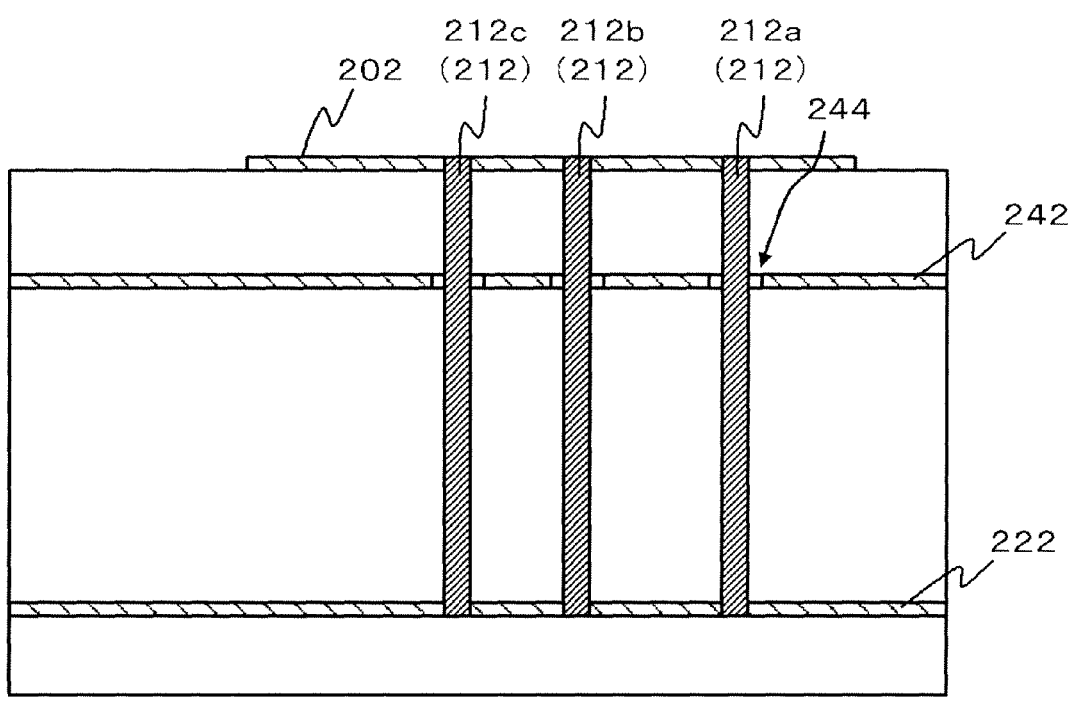
FIG. 8 is a cross-sectional view illustrating a structure of the interconnection substrate by design data stored in a design information storing unit in a state before performing a process shown in FIG. 7.
Figure 9:
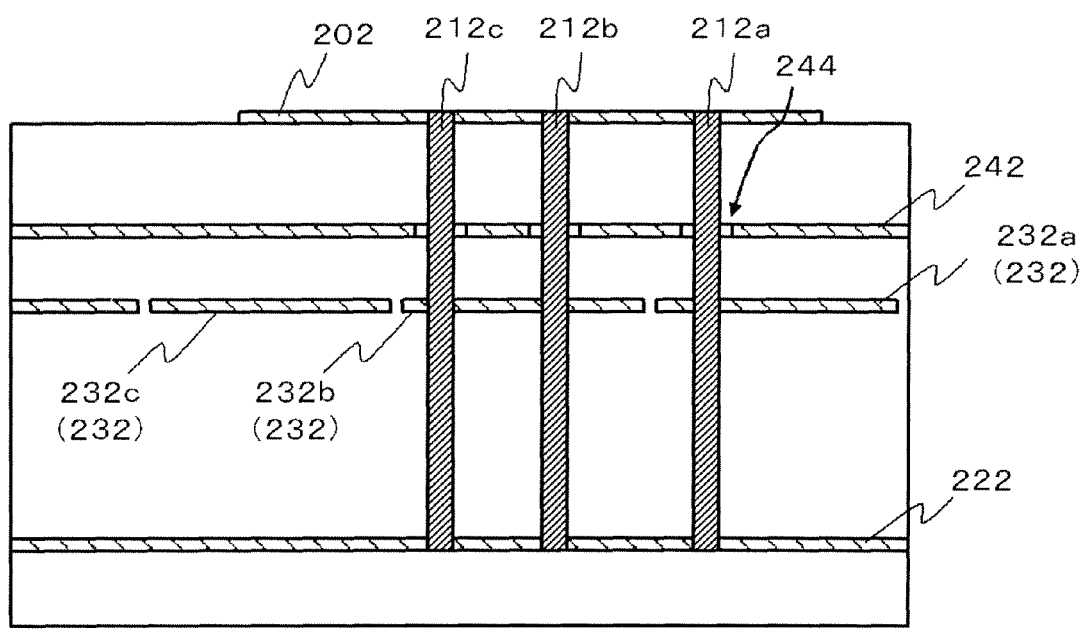
FIG. 9 is a cross-sectional view of the interconnection substrate for illustrating the process shown in FIG. 7.
Figure 10:
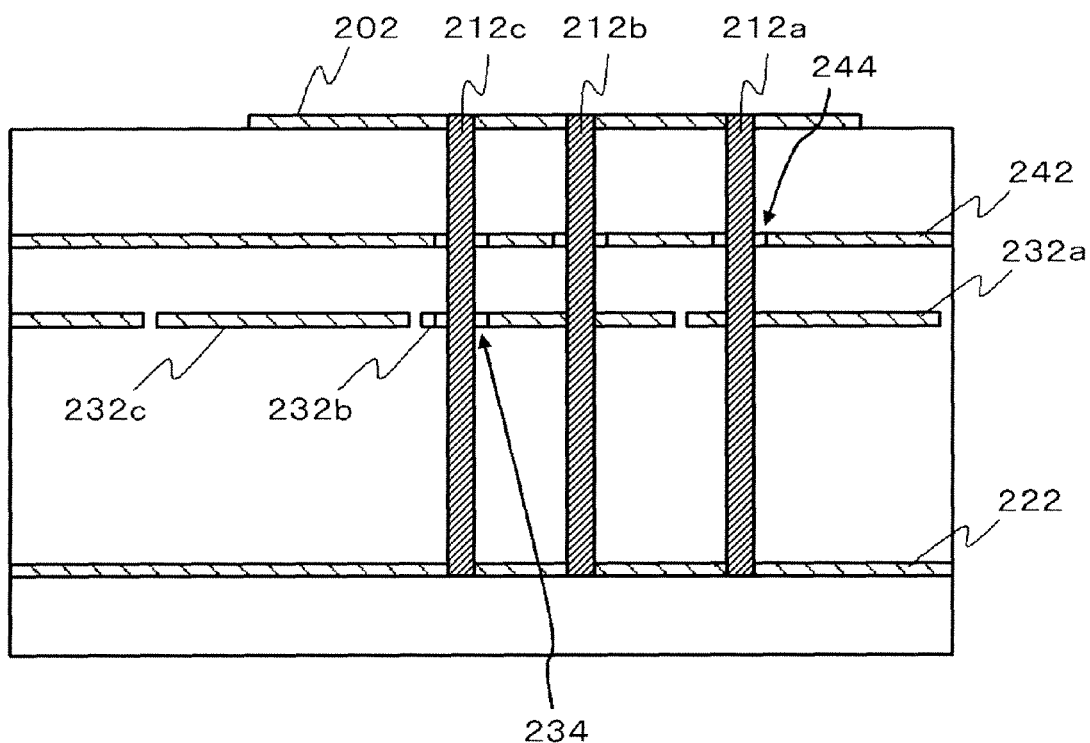
FIG. 10 is a cross-sectional view of the interconnection substrate for illustrating the process shown in FIG. 7.
Figure 11:
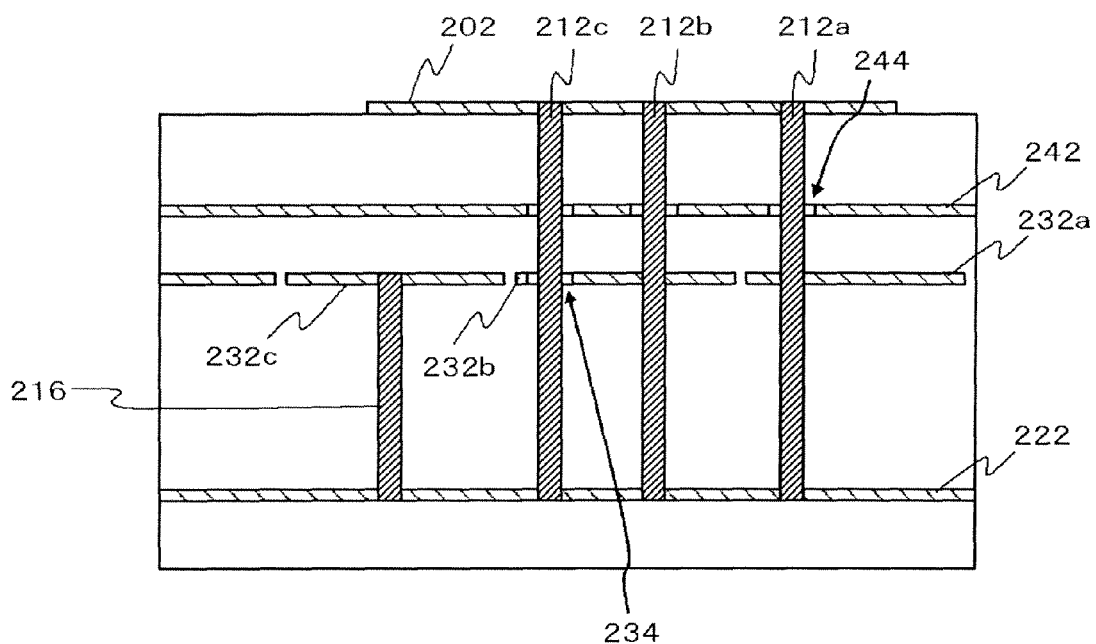
FIG. 11 is a cross-sectional view of the interconnection substrate for illustrating the process shown in FIG. 7.

FIG. 7 shows a flowchart illustrating a method of designing the interconnection substrate 200 using the interconnection substrate design supporting device shown in FIG. 6. FIG. 8 shows a cross-sectional view illustrating a structure of the interconnection substrate 200 in the design data stored in the design information storing unit 10 before a process shown in FIG. 7 is performed. FIG. 9 to FIG. 11 show cross-section views of the interconnection substrate 200 for illustrating a process shown in FIG. 7.

As shown in the cross-sectional view of FIG. 8, before a process shown in FIG. 7 is performed, the interconnection substrate 200 in the design data stored in the design information storage unit 10 is provided with the first conductor 222, the third conductor 242, conductor patterns 201 and 202, interconnects 203a, 203b, and 204, the first vias 212, and the third openings 244.

First, the via disposition information acquiring unit 30 of the interconnection substrate design supporting device reads out via disposition information from the design information storage unit 10 (step S10 in FIG. 7). The second conductor information acquiring unit 40 reads out second conductor information from the second conductor information storage unit 20 (step S20 in FIG. 7).

The via extracting unit 50 introduces the plurality of second conductors 232 to the second conductor layer 230 of the interconnection substrate 200 on the basis of the second conductor information. The via extracting unit 50 extracts an extraction via with respect to each of the plurality of second conductors 232 (step S30 in FIG. 7, and FIG. 9). The extraction via is each of the first vias 212 overlapping the second conductor 232. In an example shown in FIG. 9, first vias 212a to 212c are extracted as the extraction vias. One first via 212a overlaps a second conductor 232a, and two first vias 212b and 212c overlap a second conductor 232b. Any of the first vias 212 does not overlap a second conductor 232c.

The via selecting unit 60 selects a selection via with respect to each of the plurality of second conductors 232 (step S40 in FIG. 7). The selection via is each of the first vias 212 selected in a predetermined number from the extraction vias. The opening introducing unit 70 introduces the first opening 234 to each of the plurality of second conductors 232 (step S50 in FIG. 7, and FIG. 10). The first opening 234 is located at a position overlapping each of the extraction vias not selected by the via selecting unit 60 in plan view. In an example shown in FIG. 10, the first via 212a is selected as a selection via with respect to the second conductor 232a, and the first via 212b is selected as a selection via with respect to the second conductor 232b. The first via 212c is extracted as an extraction via, but not selected as a selection via. Thus, the first opening 234 is introduced to the second conductor 232b at a position overlapping the first via 212c in plan view.

The second conductor selecting unit 80 selects, from the plurality of the second conductors 232, a second conductor 232 in which the extraction via is not selected (step S60 in FIG. 7). The second via introducing unit 90 performs a process of introducing the second via 216 to the interconnection substrate (step S70 in FIG. 7, and FIG. 11). The second via 216 connects the first conductor to the second conductor 232 selected by the second conductor selecting unit 80. In an example shown in FIG. 11, the second conductor 232c is selected by the second conductor selecting unit 80. The second via 216 is introduced to the second conductor 232c. A region to which the second via 216 is introduced is, for example, a region overlapping the semiconductor package 300 in plan view.

Then, the second via introducing unit 90 updates design data stored in the design information storage unit 10 into the design data in which the plurality of second conductors 232, the first opening 234, and the second via 216 have been introduced (step S80 in FIG. 7).

Figure 12:
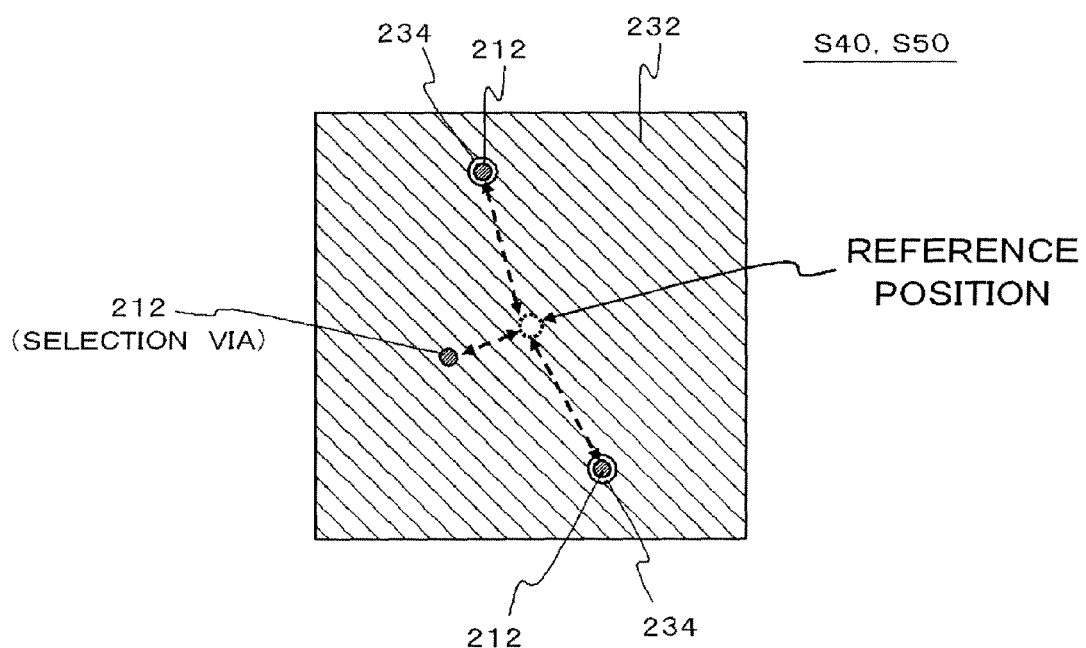
FIG. 12 is a schematic diagram illustrating a first example of step S40 in FIG. 7.

FIG. 12 shows a schematic diagram illustrating a first example of a process (step S40 in FIG. 7) of selecting the selection via by the via selecting unit 60. In this example, the via selecting unit 60 selects a selection via. The selection via is the first via 212 nearest to a reference position among the extraction vias.

Figure 13:
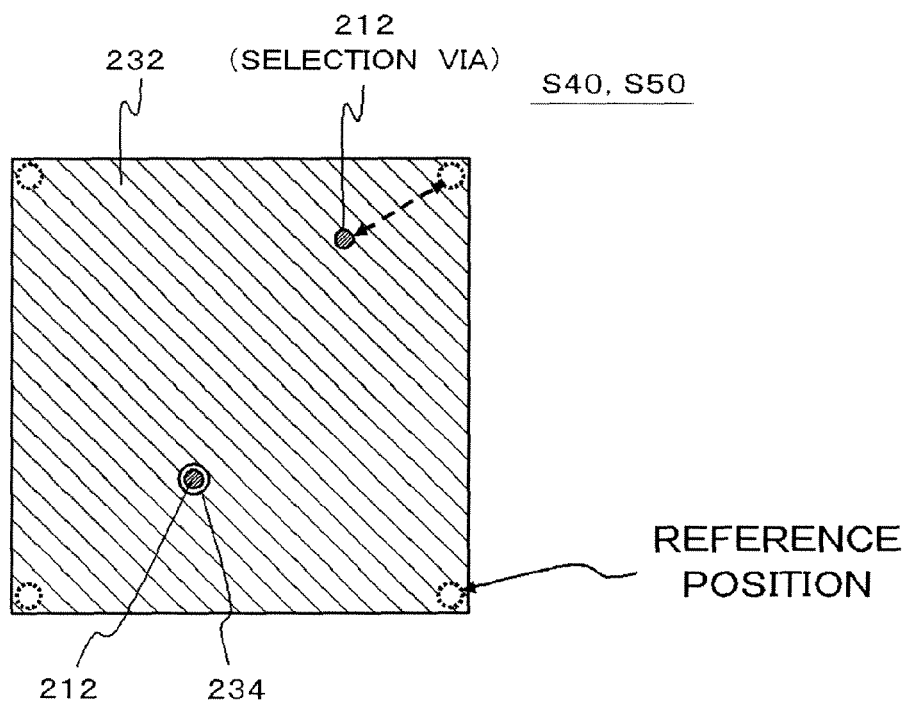
FIG. 13 is a schematic diagram illustrating a second example of step S40 in FIG. 7.

FIG. 13 shows a schematic diagram illustrating a second example of a process (step S40 in FIG. 7) of selecting the selection via by the via selecting unit 60. In this example, a planar shape of each of the second conductors 232 is a polygon, for example, a square. The via selecting unit 60 selects a selection via. The selection via is the first via 212 nearest to any one of corners of the polygon among the extraction vias. In an example shown in this drawing, the first via 212 located at an upper side in the drawing is the nearest to an upper right corner in the drawing. Thus, the first via 212 located at an upper side in the drawing is selected as the selection via.

Figure 14:
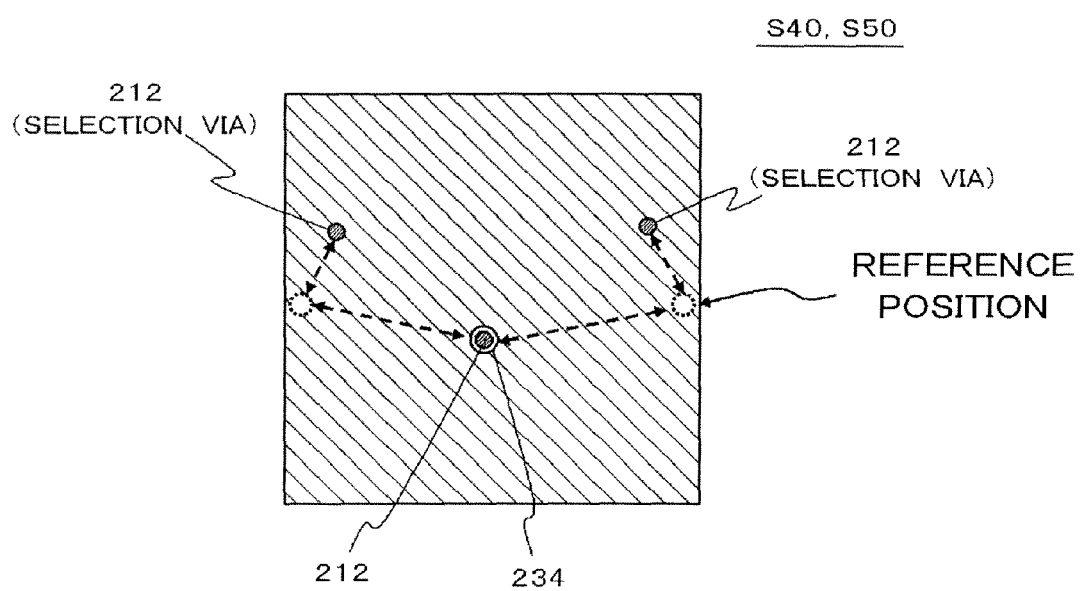
FIG. 14 is a schematic diagram illustrating a third example of step S40 in FIG. 7.

FIG. 14 shows a schematic diagram illustrating a third example of a process (step S40 in FIG. 7) of selecting the selection via by the via selecting unit 60. In this example, the reference position is two or more in number. The via selecting unit 60 selects a selection via with respect to each of the plurality of reference positions. The selection via is the first via 212 nearest to each of the reference positions. In an example shown in this drawing, the second conductor 232 is formed in a square, and the reference positions are set in the vicinity of centers of two sides opposite to each other. The first via 212 nearest to each of the two reference positions is selected as the selection via, and the first opening 234 is introduced at the periphery of a first via 212 located at a substantially center of the two reference positions.

Figure 15:
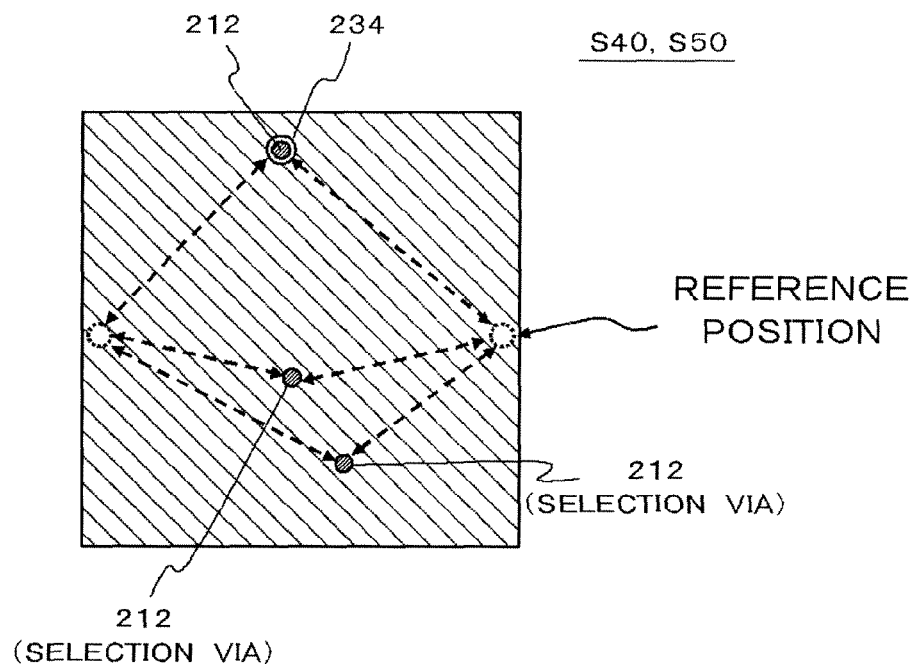
FIG. 15 is a schematic diagram illustrating a fourth example of step S40 in FIG. 7.

FIG. 15 shows a schematic diagram illustrating a fourth example of a process (step S40 in FIG. 7) of selecting the selection via by the via selecting unit 60. In this example, the via selecting unit 60 selects a plurality of first vias 212 as a selection via. Specifically, the reference position is set to be two or more in number, for example, in the same number as that of selection vias. The via selecting unit 60 calculates a total value of distances from the plurality of reference positions to each of the extraction vias. Then, the via selecting unit 60 selects the selection via in the order in which the total value is small. In an example shown in the drawing, the selection via and the reference position are each two in number. The first via 212 is selected as the selection via, except the first via 212 located at the uppermost position in the drawing.

Next, an operation and an effect of this embodiment will be described. According to this embodiment, the structure is constructed by selection of a part of existing first vias 212. When a first via 212 not making up the structure is electrically connected to the second conductor 232, the structure property as a metamaterial is deviated from its intended design, and this is not preferable. Contrary to this, in this embodiment, the first opening 234 is introduced to the second conductor 232 at a region overlapping the first via 212 not making up the structure. This can prevent an unnecessary first via 212 from connecting to the metamaterial structure, and as a result, the metamaterial property can be prevented from deviating from its intended design when the metamaterial structure is introduced to an already-designed interconnection substrate. Since the metamaterial structure may be introduced to the already-designed interconnection substrate, past design data of the interconnection substrate may be effectively utilized. As a result, a designing cost of the interconnection substrate 200 may be lowered.

In this embodiment, the second via introducing unit 90 introduces the second via 216 to the second conductor 232 not overlapping any first via 212. This introduction can prevent the second conductor 232 from not making up the unit cell 500. As a result, the structure may be reliably introduced to a desired region.

Second Embodiment

Figure 16:
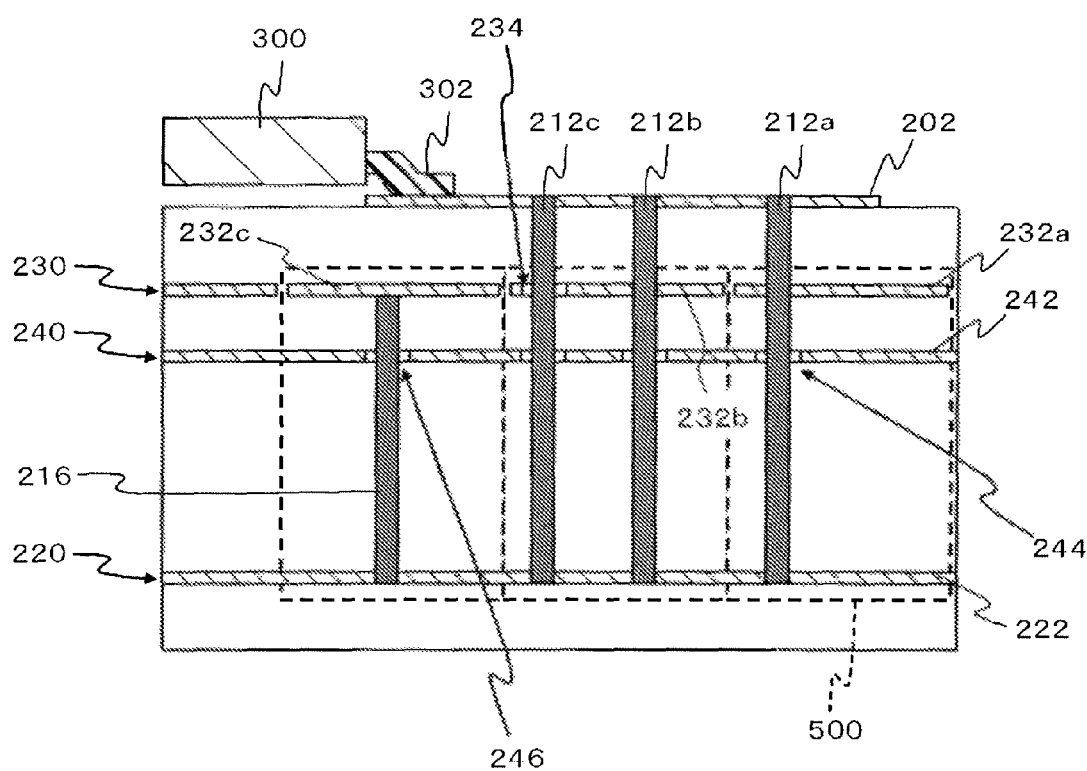
FIG. 16 is a cross-sectional view illustrating a configuration of an electronic device according to a second embodiment.

FIG. 16 shows a cross-sectional view illustrating a configuration of an electronic device according to a second embodiment, and corresponds to FIG. 1 in the first embodiment. The electronic device according to this embodiment has the same configuration as the first embodiment except for the following points.

First, the second conductor layer 230 of the interconnection substrate 200 is located nearer to one surface side of the interconnection substrate 200 than the third conductor layer 240. The third conductor 242 is provided with an opening 246 at a region overlapping the second via 216 in plan view. The opening 246 is introduced to the third conductor 242 when the second via introducing unit 90 introduces the second via 216. The introduction of the opening 246 prevents the second via 216 from being short-circuited with the third conductor 242.

According to this embodiment, the same effect as the first embodiment may also be obtained. Since the second conductor 232 is positioned above the third conductor 242 having a sheet shape, the length of the via 216 and the length of a portion of the via 212 connecting the first conductor 222 to the second conductor 232 each becomes longer compared to the first embodiment. This results in large inductance, and allows a bandgap frequency band of the structure to shift toward a low frequency side.

Third Embodiment

Figure 17:
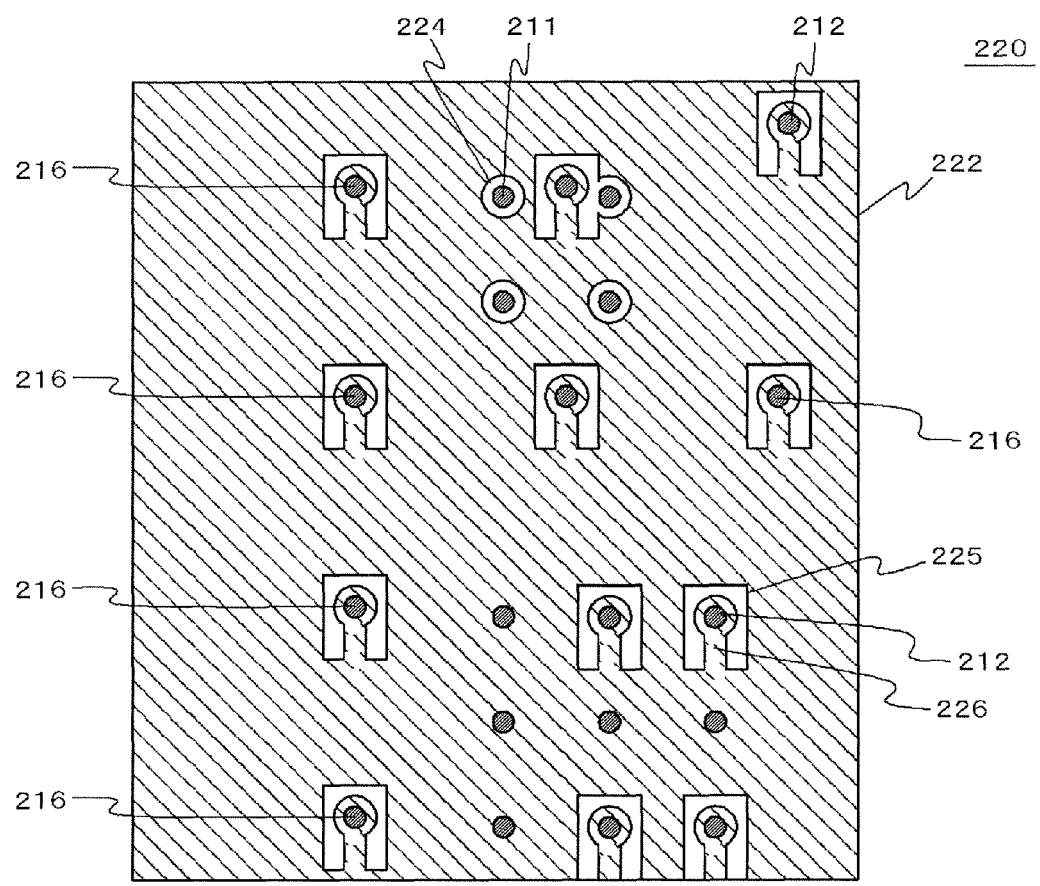
FIG. 17 is a plan view illustrating a configuration of a first conductor layer of an interconnection substrate according to a third embodiment.

FIG. 17 shows a plan view illustrating a configuration of a first conductor layer 220 of an interconnection substrate 200 according to a third embodiment. This embodiment is substantially the same as the first embodiment except that a plurality of second openings 225 and a plurality of interconnects 226 are provided to the first conductor 222 of the first conductor layer 220. The second openings 225 and the interconnects 226 are formed by selective removal of the first conductor 222.

The second openings 225 are provided with respect to each of vias selected as a selection via from the first vias 212, and the second vias 216 in a manner such that each of the second openings 225 includes each of these vias inside. One end of the interconnects 226 is connected to each of the first via 212 or the second vias 216, and the other end is connected to the first conductor 222 (an edge of the second opening 225).

In this embodiment, the second via introducing unit 90 also functions as an opening introducing unit. That is, the second via introducing unit 90 performs a process of selectively removing a portion located at the periphery of each of the selected first vias 212 selected as a selection via and a portion located at the periphery of each of the second vias 216, in the first conductor 222, and thereby introduces the second openings 225 and the interconnects 226.

According to this embodiment, the same effect as the first embodiment also may be obtained. The interconnects 226 function as an inductance portion of a mushroom-structured metamaterial together with the second vias 216. For this reason, inductance in the mushroom-structured metamaterial may increase. When this inductance increases, the bandgap frequency band of the metamaterial shifts toward a low frequency side.

Fourth Embodiment

Figure 18:
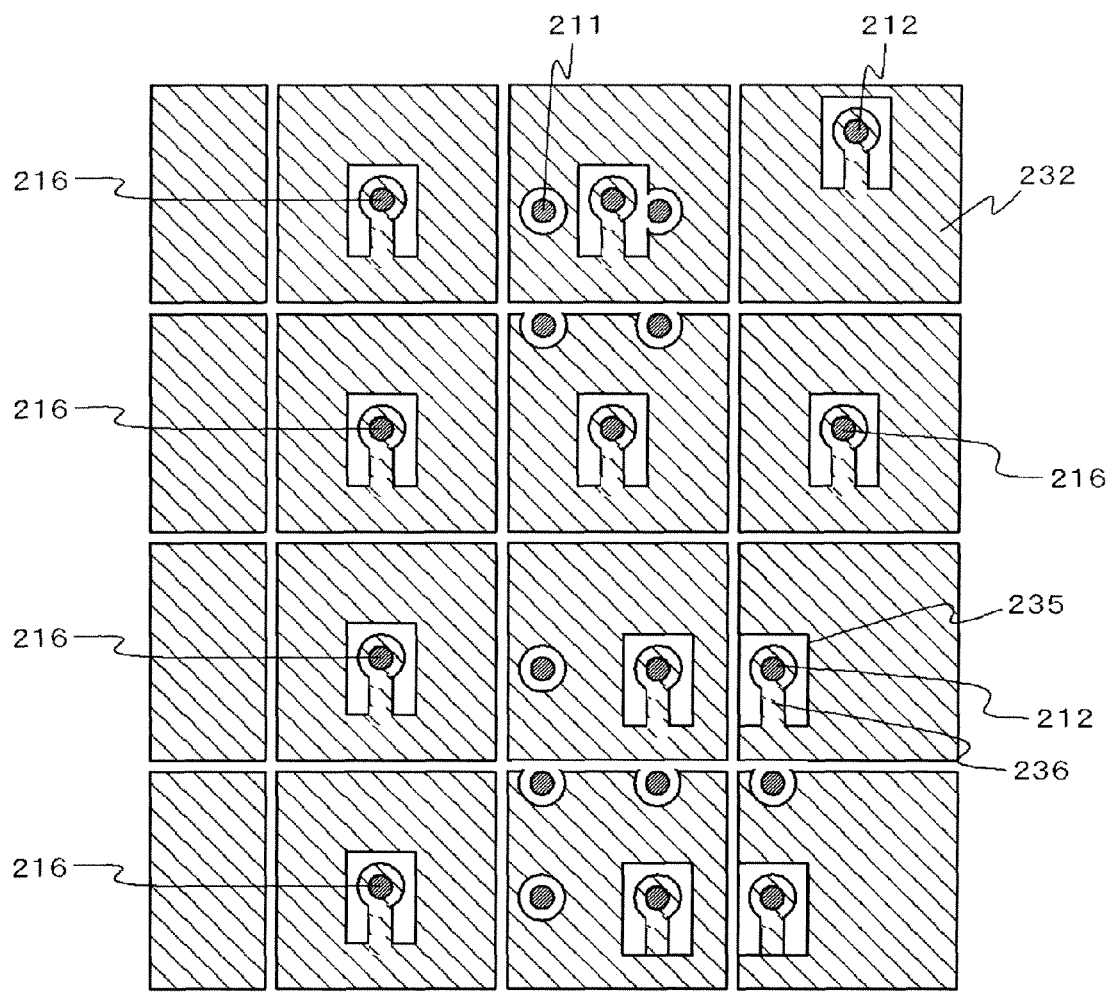
FIG. 18 is a plan view illustrating a configuration of a second conductor layer of an interconnection substrate according to a fourth embodiment.

FIG. 18 shows a plan view illustrating a configuration of a second conductor layer 230 of an interconnection substrate 200 according to a fourth embodiment. This embodiment is substantially the same as the first to third embodiments except that a plurality of second openings 235 and a plurality of interconnects 236 are provided to the second conductors 232 of the second conductor layer 230. The second openings 235 and the interconnects 236 are formed by selective removal of the second conductors 232. The disposition and shape of the second opening 235 and the interconnects 236 are the same as the second openings 225 and the interconnects 226 in the third embodiment.

In this embodiment, the second via introducing unit 90 functions as an opening introducing unit. That is, the second via introducing unit 90 performs a process of selectively removing a portion located at the periphery of each of the selected first vias 212 selected as a selection via and a portion located at the periphery of each of the second vias 216, in the second conductor 232, and thereby introduces the second openings 235 and the interconnects 236.

According to this embodiment, the same effect as the third embodiment also may be obtained. Since the second opening 235 and the interconnects 236 are introduced to the second conductors 232 not making up a power supply pattern or a ground pattern, stability of the power supply potential and ground potential are raised compared to a case in which the second openings or the interconnects are introduced to the power supply pattern or the ground pattern.

Fifth Embodiment

Figure 19:
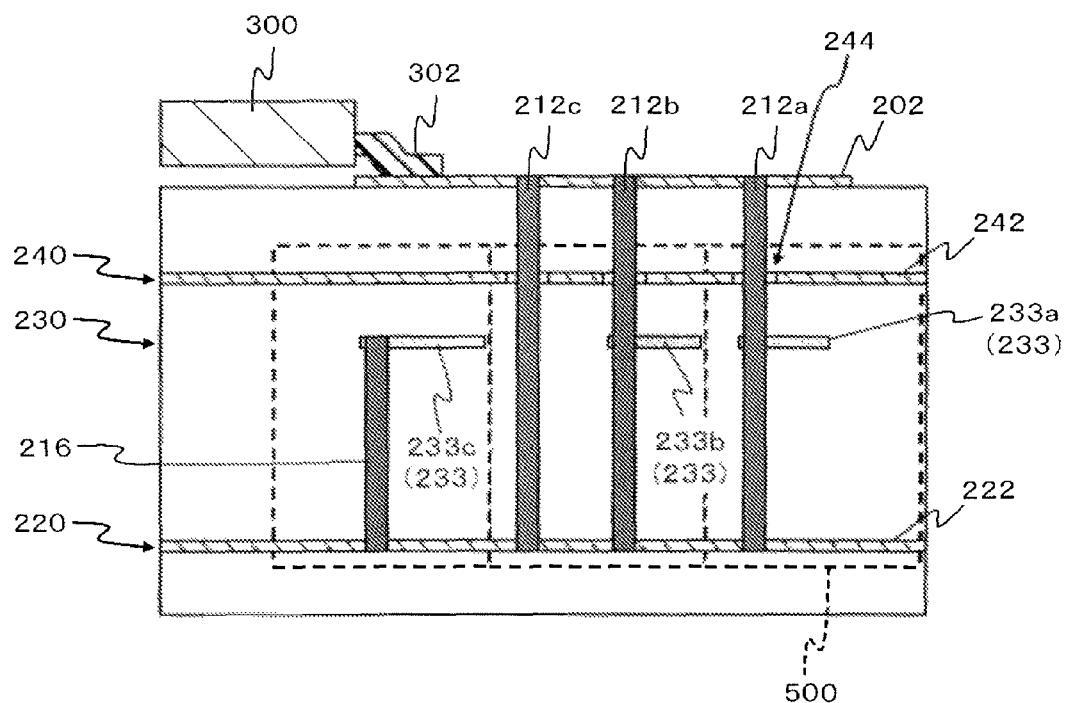
FIG. 19 is a cross-sectional view illustrating a configuration of an electronic device according to a fifth embodiment.
Figure 20:
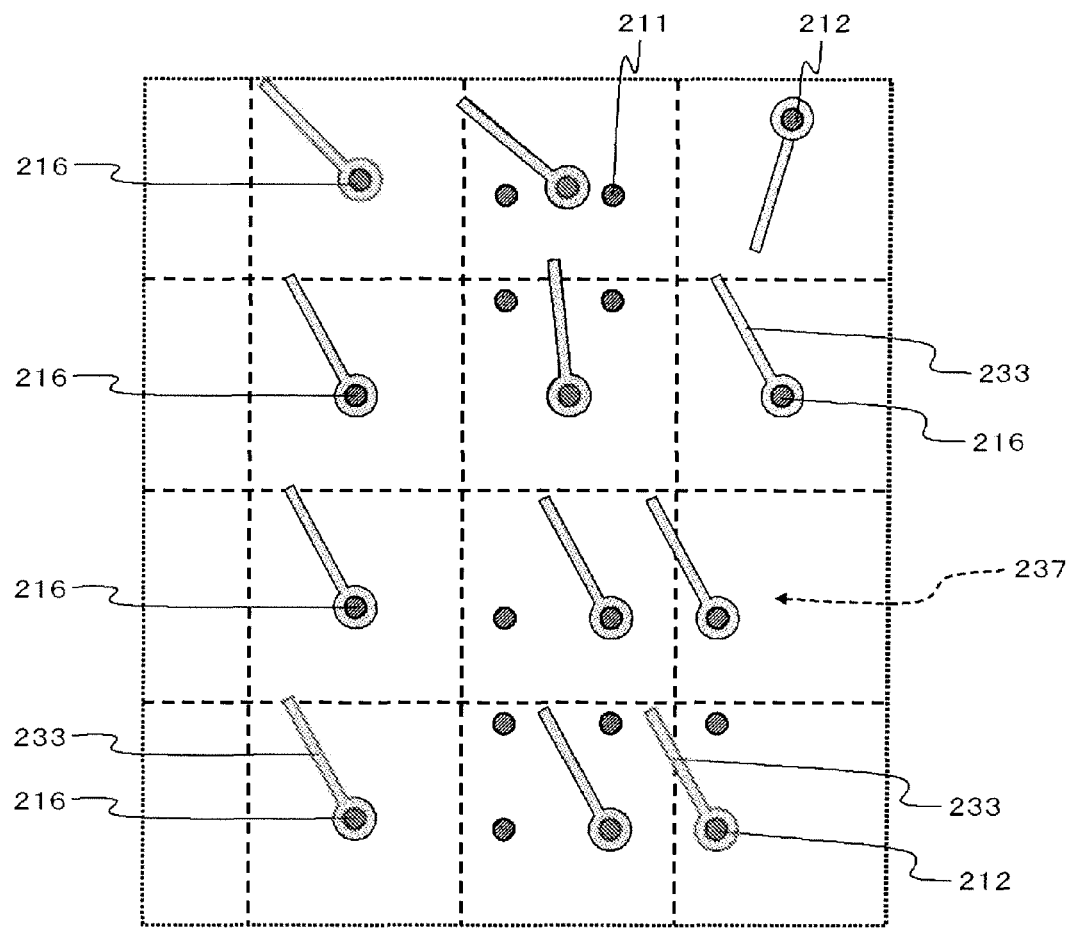
FIG. 20 is a plan view of a second conductor layer of an interconnection substrate of the electronic device shown in FIG. 19.

FIG. 19 shows a cross-sectional view illustrating a configuration of an electronic device according to a fifth embodiment, and corresponds to FIG. 1 in the first embodiment. FIG. 20 shows a plan view of a second conductor layer 230 of an interconnection substrate 200 of the electronic device shown in FIG. 19. This electronic device has substantially the same configuration as the electronic device according to the first embodiment except that the second conductors 233 instead of the second conductors 232 are provided to the second conductor layer 230.

In this embodiment, the second conductor layer 230 is partitioned into a plurality of disposition-permitted regions 237. Each one of the second conductors 233 is provided in each of the disposition regions 237. The second conductor 233 is provided with respect to each of the first vias 212 and the second vias 216 selected as a selection via. The second conductor 233 is an interconnect-shaped conductor, and one end of the second conductor 233 is connected to the first via 212 or the second via 216, and the other end is formed of an open terminal. The second conductor 233 is connected to only the first via 212 or the second via 216. The second conductor 233 is not provided to the first via 212 not selected as a selection via in the first vias 212. In an example shown in this drawing, the unit cell 500 is made up by the second conductor 233, a region of the first conductor 222 opposite to the second conductor 232, the first via 212 in contact with both the second conductor 232 and the first conductor 222, and a region of the third conductor 242 opposite to the second conductor 232. The second conductor 233 functions as an open stub.

Figure 21:
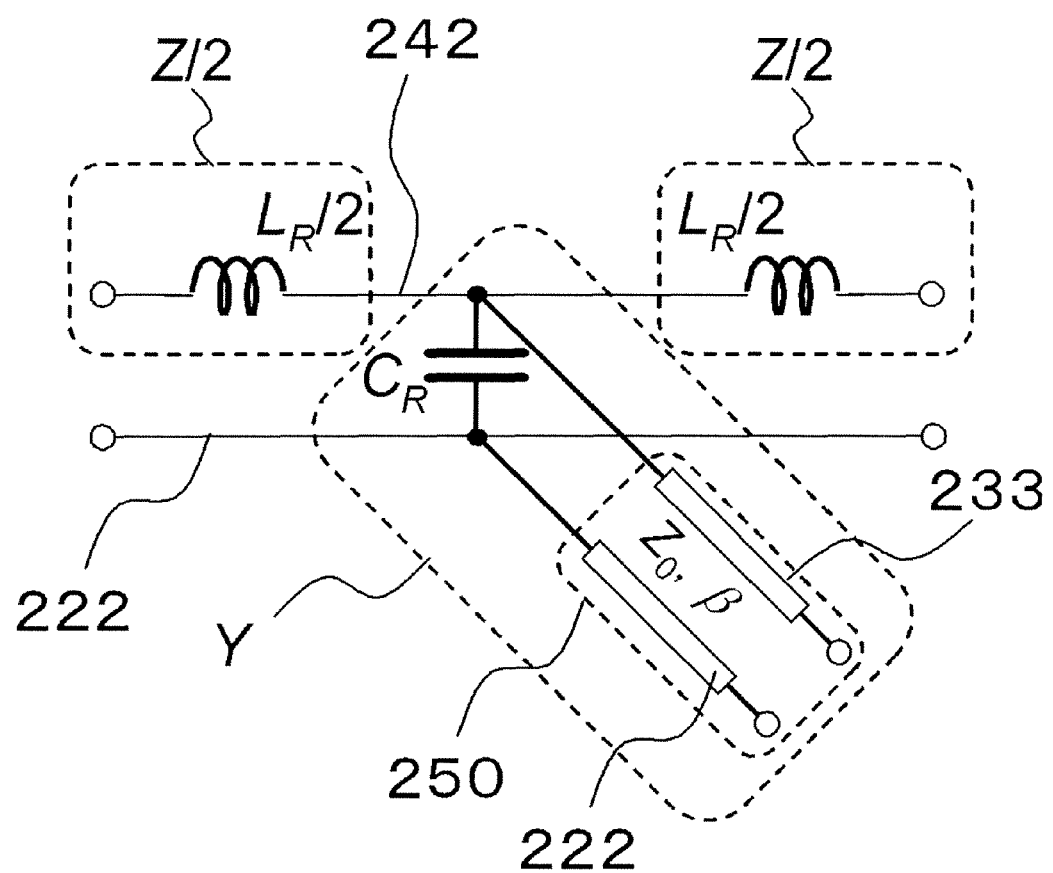
FIG. 21 is an equivalent circuit diagram of a unit cell in FIG. 19.

FIG. 21 shows an equivalent circuit diagram of the unit cell 500 in FIG. 19. As shown in this drawing, parasitic capacitance $C_R$ is formed between the third conductor 242 and the first conductor 222. Inductance $L_R$ is formed in the third conductor 242. As described above, the second conductor 233 functions as an open stub. The second conductor 233 and a portion of the first conductor 222 opposite to the second conductor 233 form a transmission line 250, for example, a microstrip line. The other end of the transmission line 250 is formed of an open terminal.

A characteristic of an electromagnetic wave propagating through a structure is determined by serial impedance Z based on the inductance $L_R$, and admittance Y based on the transmission line 250 and the parasitic capacitance $C_R$. More specifically, input admittance of the transmission line 250 is determined by a line length of the transmission line 250 (that is, the length of the second conductor 233) and an effective dielectric constant of the transmission line 250. The input admittance of the transmission line 250 in any frequency becomes capacitative or inductive dependent on the line length and the effective dielectric constant of the transmission line 250. In general, the effective dielectric constant of the transmission line 250 is apt to be determined by a dielectric material making up a waveguide. Contrary to this, a freedom of degree is present in the line length of the transmission line 250, and as a result, it is possible to design the line length of the transmission line 250 in a manner such that the admittance Y in a desired band becomes inductive.

In the equivalent circuit diagram of the unit cell 500, when the line length of the transmission line 250 is made to be long, the bandgap shifts toward a low frequency side. In general, when the size of the unit cell 500 is made to be small, the bandgap band shifts toward a high frequency side, but when the line length of the transmission line 250 is made to be long, it is possible to make the size of the unit cell 500 be small without changing the lower limit frequency of the bandgap.

Figure 22:
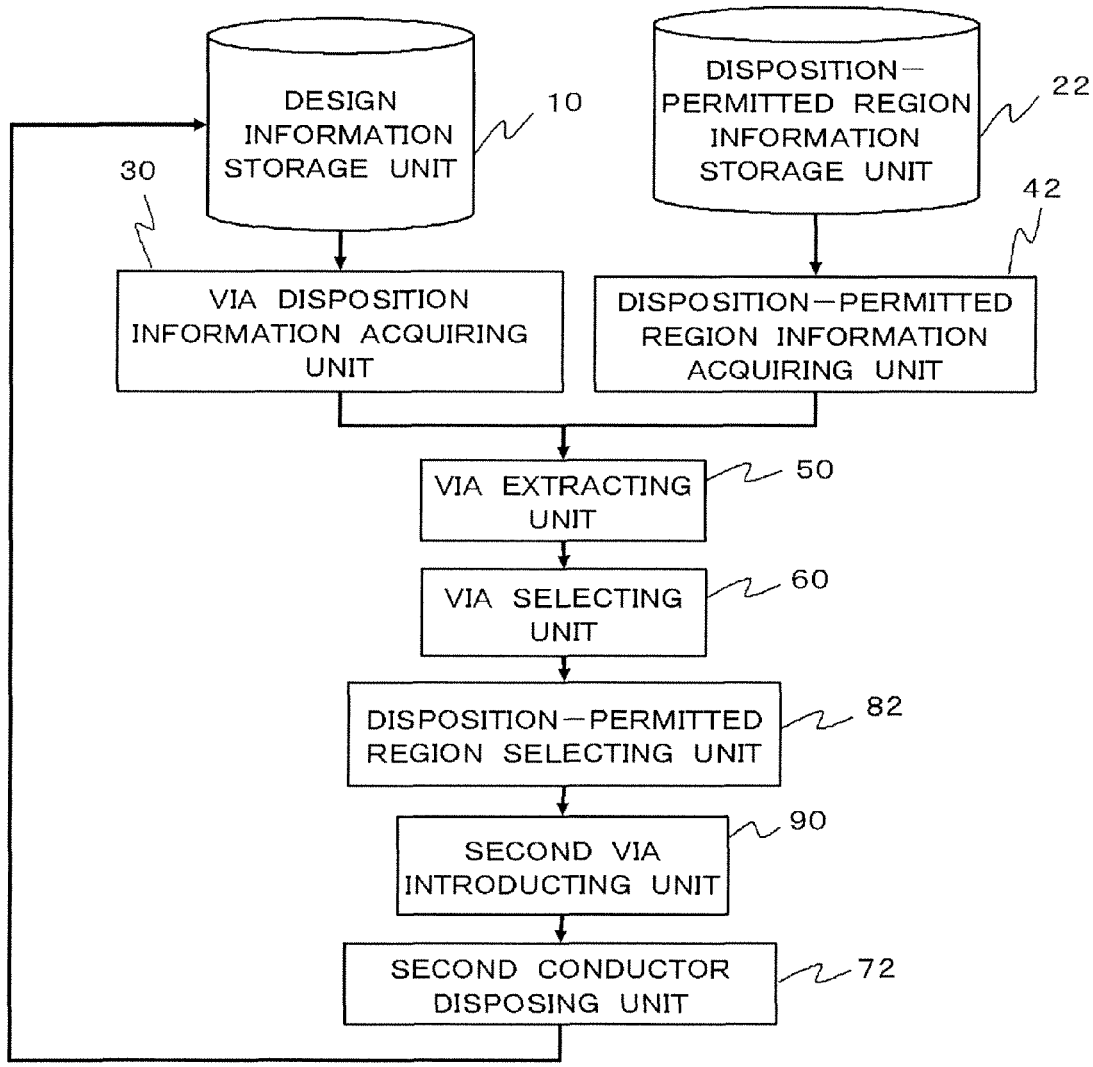
FIG. 22 is a block diagram illustrating a functional configuration of an interconnection substrate design supporting device for supporting the design of the interconnection substrate shown in FIG. 19.

FIG. 22 shows a block diagram illustrating a functional configuration of the interconnection substrate design supporting device for supporting the design of the interconnection substrate 200 shown in FIG. 19. This interconnection substrate design supporting device has substantially the same configuration as the interconnection substrate design supporting device shown in FIG. 6 except for the following points. First, a disposition-permitted region information storage unit 22 is provided instead of the second conductor information storage unit 20. A disposition-permitted region information acquiring unit 42 is provided instead of the second conductor information acquiring unit 40. A disposition-permitted region selecting unit 82 is provided instead of the second conductor selecting unit 80. The opening introducing unit 70 is not provided. A second conductor disposing unit 72 is provided.

The disposition-permitted region information storage unit 22 stores disposition-permitted region information. The disposition-permitted region information indicates a shape and a position of a disposition-permitted region 237 of the second conductor 233 with respect to each of a plurality of the second conductors 233 repeatedly disposed in the second conductor layer 230. The disposition-permitted region information acquiring unit 42 reads out the disposition-permitted region information from the disposition-permitted region information storage unit 22. The via extracting unit 50 extracts an extraction via with respect to each of the plurality of second conductors 233. The extraction via is each of the first vias 212 overlapping the disposition-permitted region 237 of the second conductor 233. The via selecting unit 60 selects a selection via with respect to each of the plurality of second conductors 233. The selection via is each of the first vias 212 selected in a predetermined number from the extraction vias. The second conductor disposing unit 72 determines the disposition of the second conductor 233 in a manner such that for example, one end of the second conductor 233 is connected to the first via 212 serving as a selection via.

In this embodiment, the disposition-permitted region selecting unit 82 selects, from a plurality of the disposition-permitted regions 237, a disposition-permitted region 237 in which the extraction via is not selected. The second via introducing unit 90 introduces the second via 216 to the disposition-permitted region 237 selected by the disposition-permitted region selecting unit 82. The second via 216 connects the second conductor 233 to the first conductor 222. The second conductor disposing unit 72 determines the disposition of the second conductor 233 in a manner such that for example, one end of the second conductor 233 is connected to the second via 216 in the disposition-permitted region 237 selected by the disposition-permitted region selecting unit 82.

Figure 23:
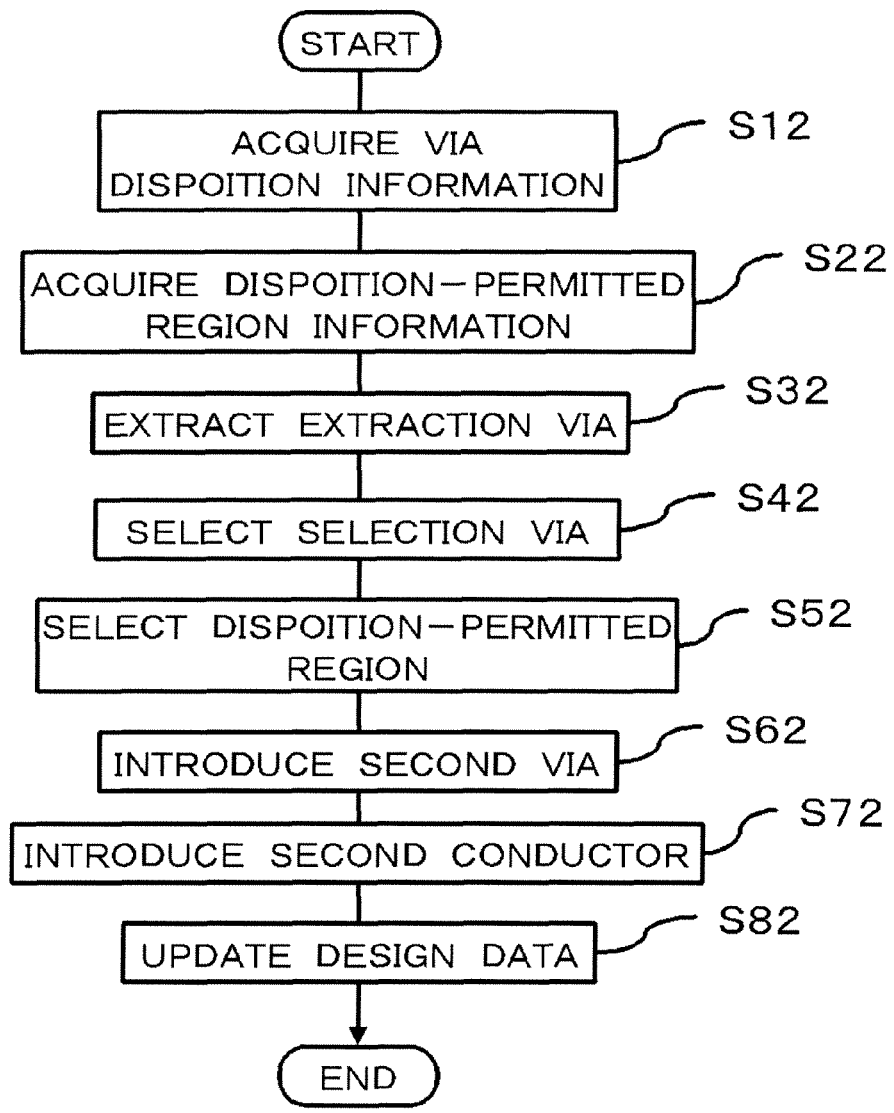
FIG. 23 is a flowchart illustrating a method of designing the interconnection substrate using the interconnection substrate design supporting device shown in FIG. 22.

FIG. 23 shows a flowchart illustrating a method of designing the interconnection substrate 200 using the interconnection substrate design supporting device shown in FIG. 22. Before a process shown in FIG. 22 is performed, the interconnection substrate 200 in the design data stored in the design information storage unit 10 is in a state shown in FIG. 8.

First, the via disposition information acquiring unit 30 of the interconnection substrate design supporting device reads out via disposition information from the design information storage unit 10 (step S12). The disposition-permitted region information acquiring unit 42 reads out disposition-permitted region information from the disposition-permitted region information storage unit 22 (step S22).

The via extracting unit 50 introduces the plurality of disposition-permitted regions 237 to the second conductor layer 230 of the interconnection substrate 200 on the basis of the disposition-permitted region information. The via extracting unit 50 also extracts an each extraction via with respect to each of the plurality of disposition-permitted regions 237 (step S32). The extraction via is each of the first vias 212 overlapping the second conductor 232. In an example shown in FIG. 19, a first via 212a to a first via 212c are extracted as the extraction via.

The via selecting unit 60 selects a selection via with respect to each of the plurality of disposition-permitted regions 237 (step S42). The selection via is each of first vias 212 selected in a predetermined number (for example, 1) from the extraction vias.

The disposition-permitted region selecting unit 82 selects, from the plurality of disposition-permitted regions 237, the disposition-permitted region 237 in which the extraction via is not selected (step S52). The second via introducing unit 90 performs a process of introducing the second via 216 to the interconnection substrate with respect to the disposition-permitted region 237 selected by the disposition-permitted region selecting unit 82 (step S62). The region to which the second via 216 is introduced is, for example, a region overlapping the semiconductor package 300 in plan view.

The second conductor disposing unit 72 introduces the second conductor 233 so that the disposition of the second conductor 233 is made to be connected to the first via 212 serving as a selection via. The second conductor disposing unit 72 introduces the second conductor 233 in a manner such that for example, one end of the second conductor 233 is connected to the second via 216 in the disposition-permitted region 237 selected by the disposition-permitted region selecting unit 82 (step S72).

Then, the second conductor disposing unit 72 updates the design data stored in the design information storage unit 10 into the design data in which the plurality of the second conductors 237 and the second vias 216 have been introduced (step S82).

According to this embodiment, the same effect as the first embodiment may be obtained. A metamaterial having a structure different from that in the first embodiment may be introduced to the interconnection substrate 200. The metamaterial is provided with an interconnect-shaped second conductor 233 instead of an island-shaped second conductor 232 in the second conductor layer 230. Accordingly, a signal line can extend in the second conductor layer 230 as if it crept in the gap of the second conductors 233.

Hereinbefore, description has been made with respect to the embodiments of the invention with reference to the drawings, but this is illustrative only and various configurations other than the above-described configurations may be adopted. For example, in the above-described respective embodiments, the semiconductor package 300 or the like is mounted on the interconnection substrate 200, but the interconnection substrate 200 may be an interposer substrate on which a semiconductor chip is mounted.

The present application claims priority from Japanese Patent Application No. 2009-241648, filed Oct. 20, 2009, the content of which is incorporated herein by reference.

The invention claimed is:

1. An interconnection substrate comprising:
   a first conductor layer in which a first conductor is provided;
   a second conductor layer in which a plurality of second conductors are repeatedly provided at regions, each overlapping the first conductor in plan view; and
   a plurality of first vias having one end connecting to the first conductor and the other end penetrating through the second conductor layer,
   wherein each of the plurality of second conductors connects to the first conductor through either the first vias or a second via,
   a second conductor of the plurality of second conductors connects to a first one of the plurality of first vias, and includes an opening at a region overlapping a second one of the plurality of first vias, and
   said first conductor, said second conductor and said first one of the plurality of first vias connecting to said second conductor configure at least a part of a metamaterial structure.

2. The interconnection substrate according to claim 1, further comprising:
   a third conductor layer located at the same side as the second conductor layer from a viewpoint of the first conductor layer,
   wherein the third conductor layer has a third conductor at a region overlapping the first conductor in plan view,
   the plurality of first vias extend to one surface of the interconnection substrate, and
   the third conductor has a plurality of third openings, each overlapping each of the plurality of first vias in plan view.

3. The interconnection substrate according to claim 2, further comprising:
   an electronic device mounted on one surface,
   wherein the electronic device connects to at least one of the first vias.

4. An interconnection substrate comprising:
   a first conductor layer in which a first conductor is provided;
   a second conductor layer;
   a plurality of first vias having one end connecting to the first conductor and the other end penetrating through the second conductor layer; and
   a plurality of interconnect-shaped second conductors repeatedly provided in the second conductor layer, each having one end connecting to any one of the first vias, and the plurality of interconnect-shaped second conductors being connected only to the first vias,
   wherein some of the plurality of first vias do not connect to the plurality of interconnect-shaped second conductors, and
   said first conductor, an interconnect-shaped second conductor of the plurality of interconnect-shaped second conductors, and a first via of the plurality of first vias connecting to said interconnect-shaped second conductor configure at least a part of a metamaterial structure.

5. An interconnection substrate design supporting device designing an interconnection substrate, the interconnection substrate including a first conductor layer, a second conductor layer, and a plurality of first vias extending from the first conductor layer to the second conductor layer and having one end connecting to a first conductor in the first conductor layer, the device comprising:
- a processing unit of a computer, comprising:
  - a via disposition information acquiring unit acquiring via disposition information indicating a disposition of the plurality of first vias;
  - a second conductor information acquiring unit acquiring second conductor information indicating disposition positions of a plurality of second conductors, the plurality of second conductors being repeatedly disposed in the second conductor layer;
  - a via extracting unit extracting an extraction via with respect to each of the plurality of second conductors, the extraction via being each of the first via overlapping the second conductor;
  - a via selecting unit selecting a selection via with respect to each of the plurality of second conductors, the selection via being each of the first vias selected in a predetermined number from the extraction vias; and
  - an opening introducing unit introducing a first opening to each of the plurality of second conductors, the first opening being overlapping the extraction via not selected by the via selecting unit in plan view.

6. The interconnection substrate design supporting device according to claim 5, further comprising:
- a second conductor selecting unit selecting, from the plurality of second conductors, the second conductor in which the extraction via is not extracted; and
- a second via introducing unit introducing a second via, the second via connecting the second conductor to the first conductor, the second conductor being selected by the second conductor selecting unit.

7. The interconnection substrate design supporting device according to claim 5, wherein the via selecting unit selects the selection via, the selection via being the first via nearest to a reference position among the extraction vias.

8. The interconnection substrate design supporting device according to claim 7, wherein the reference position is the center of the second conductor.

9. The interconnection substrate design supporting device according to claim 7, wherein the reference position is two or more in number, and
the via selecting unit selects the selection via with respect to each of the plurality of reference positions.

10. The interconnection substrate design supporting device according to claim 5, wherein a planar shape of each of the second conductors is a polygon, and
the via selecting unit selects the selection via, the selection via being the first via nearest to any one of corners of the polygon among the extraction vias.

11. The interconnection substrate design supporting device according to claim 5, wherein the selection vias are two or more in number,
a plurality of reference positions are set, and
the via selecting unit calculates a total value of distances from the plurality of reference positions to each of the extraction vias, and selects the selection via in the order in which the total value is small.

12. The interconnection substrate design supporting device according to claim 5, further comprising:
- a second opening introducing unit introducing a second opening and an interconnect located inside the second opening, the second opening and the interconnect being introduced by selective removal of a portion located at the periphery of the selection via with respect to at least one side of the first conductor and the second conductor, the opening introducing unit connecting one end of the interconnect to the selection via and connecting the other end to an edge of the second opening.

13. The interconnection substrate design supporting device according to claim 5, wherein the interconnection substrate includes a third conductor layer, the third conductor layer being located at the same side as the second conductor layer from a viewpoint of the first conductor layer,
the third conductor layer has a third conductor at a region overlapping the first conductor in plan view,
the plurality of first vias extend to one surface of the interconnection substrate, and
the third conductor has a plurality of third openings, each overlapping each of the plurality of first vias in plan view.

14. An interconnection substrate design supporting device designing an interconnection substrate, the interconnection substrate including a first conductor layer, a second conductor layer, and a plurality of first vias extending from the first conductor layer to the second conductor layer and having one end connecting to a first conductor in the first conductor layer, the device comprising:
- a processing unit of a computer, comprising:
  - a via disposition information acquirer acquiring via disposition information indicating a disposition of the plurality of first vias;
  - a disposition-permitted region information acquirer acquiring disposition-permitted region information with respect to each of a plurality of second conductors, the plurality of second conductors being repeatedly disposed in the second conductor layer, the disposition-permitted region information indicating a disposition-permitted region of the second conductors;
  - a via extractor extracting an extraction via with respect to each of the plurality of second conductors, the extraction via being each of the first vias overlapping the disposition-permitted region of the second conductor;
  - a via selector selecting a selection via with respect to each of the plurality of second conductors, the selection via being each of the first vias selected in a predetermined number from the extraction vias; and
  - a second conductor disposer determining the disposition of the second conductor in a manner such that the second conductor connects to the selection via.

15. The interconnection substrate design supporting device according to claim 14, further comprising:
- a disposition-permitted region selector selecting, from the plurality of disposition-permitted regions, the disposition-permitted region in which the extraction via is not selected; and
- a second via introducer introducing a second via to the disposition-permitted region selected by the disposition-permitted region selector, the second via connecting the second conductor to the first conductor,
wherein the second conductor disposer determines the disposition of the second conductor in a manner such that the second conductor connects to the second via in the disposition-permitted region selected by the disposition-permitted region selector.

16. The interconnection substrate design supporting device according to claim 14, wherein the second conductor comprises an interconnect-shaped conductor, and the second conductor disposer determines the disposition of the second conductor in a manner such that one end of the second conductor connects to the selection via.

17. A method of designing an interconnection substrate, the interconnection substrate including a first conductor layer, a second conductor layer, and a plurality of first vias extending from the first conductor layer to the second conductor layer, the plurality of first vias having one end connecting to a first conductor located in the first conductor layer, the method comprising:

in a processing unit of a computer:

acquiring via disposition information indicating a disposition of the plurality of first vias;

acquiring second conductor information indicating disposition positions of a plurality of second conductors, the plurality of second conductors being repeatedly disposed in the second conductor layer;

extracting an extraction via with respect to each of the plurality of second conductors, the extraction via being each of the first vias overlapping the second conductor;

selecting a selection via with respect to each of the plurality of second conductors, the selection via being each of first vias selected in a predetermined number from the extraction vias; and introducing a first opening to each of the plurality of second conductors, the first opening overlapping the extraction via not selected as the selection via in plan view.

18. A method of designing an interconnection substrate, the interconnection substrate including a first conductor layer, a second conductor layer, and a plurality of first vias extending from the first conductor layer to the second conductor layer, the plurality of first vias having one end connecting to a first conductor located in the first conductor layer, the method comprising:

in a processing unit of a computer:

acquiring via disposition information indicating a disposition of the plurality of first vias;

acquiring second conductor information with respect to each of a plurality of second conductors, the plurality of second conductors being repeatedly disposed in the second conductor layer, the second conductor information indicating a disposition-permitted region of the second conductors;

extracting an extraction via with respect to each of the plurality of second conductors, the extraction via being each of the first vias overlapping the disposition-permitted region of the second conductor;

selecting a selection via with respect to each of the plurality of second conductors, the selection via being each of the first vias selected in a predetermined number from the extraction vias; and determining the disposition of the second conductor in a manner such that the second conductor connects to the selection via.

19. A non-transitory computer readable medium recording a program, the program causing a computer to function as an interconnection substrate designing device that designs an interconnection substrate, the interconnection substrate including a first conductor layer, a second conductor layer, and a plurality of first vias extending from the first conductor layer to the second conductor layer, the plurality of first vias having one end connecting to a first conductor located in the first conductor layer, the program causing the computer to execute:

a function of acquiring via disposition information indicating a disposition of the plurality of first vias;

a function of acquiring second conductor information indicating disposition positions of a plurality of second conductors, the plurality of second conductors being repeatedly disposed in the second conductor layer;

a function of extracting an extraction via with respect to each of the plurality of second conductors, the extraction via being each of the first vias overlapping the second conductor;

a function of selecting a selection via with respect to each of the plurality of second conductors, the selection via being the each of first vias selected in a predetermined number from the extraction vias; and a function of introducing a first opening to each of the plurality of second conductors, the first opening overlapping the extraction via not selected as the selection via in plan view.

20. A non-transitory computer readable medium recording a program, the program causing a computer to function as an interconnection substrate designing device that designs an interconnection substrate, the interconnection substrate including a first conductor layer, a second conductor layer, and a plurality of first vias extending from the first conductor layer to the second conductor layer, the plurality of first vias having one end connecting to a first conductor located in the first conductor layer, the program causing the computer to execute:

a function of acquiring via disposition information indicating a disposition of the plurality of first vias;

a function of acquiring second conductor information with respect to each of a plurality of second conductors, the plurality of second conductors being repeatedly disposed in the second conductor layer, the second conductor information indicating a disposition-permitted region of the second conductors;

a function of extracting an extraction via with respect to each of the plurality of second conductors, the extraction via being each of the first vias overlapping the disposition-permitted region of the second conductor;

a function of selecting a selection via with respect to each of the plurality of second conductors, the selection via being each of the first vias selected in a predetermined number from the extraction vias; and a function of determining the disposition of the second conductor in a manner such that the second conductor connects to the selection via.

* * * * *